United States Patent
Lim et al.

(10) Patent No.: US 11,948,964 B2
(45) Date of Patent: Apr. 2, 2024

(54) IMAGE SENSOR HAVING VERTICAL, TRANSFER, RESET, SOURCE FOLLOWER, AND SELECT TRANSISTORS VERTICALLY ALIGNED OVER THE PHOTODIODE

(71) Applicant: SAMSUNG ELECTRONICS CO., LTD., Suwon-si (KR)

(72) Inventors: Kangmook Lim, Seoul (KR); Sungin Kim, Hwaseong-si (KR); Changhwa Kim, Hwaseong-si (KR); Yeoseon Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 623 days.

(21) Appl. No.: 16/904,708

(22) Filed: Jun. 18, 2020

(65) Prior Publication Data

US 2021/0242270 A1 Aug. 5, 2021

(30) Foreign Application Priority Data

Feb. 5, 2020 (KR) .................. 10-2020-0013689

(51) Int. Cl.
*H01L 27/146* (2006.01)

(52) U.S. Cl.
CPC .. *H01L 27/14643* (2013.01); *H01L 27/14603* (2013.01); *H01L 27/14614* (2013.01); *H01L 27/14616* (2013.01); *H01L 27/14621* (2013.01); *H01L 27/1463* (2013.01)

(58) Field of Classification Search
CPC ......... H01L 27/14603; H01L 27/14609; H01L 27/14614; H01L 27/14616; H01L 27/14643
See application file for complete search history.

(56) References Cited

U.S. PATENT DOCUMENTS

| | | | |
|---|---|---|---|
| 9,443,900 B2 | 9/2016 | Yamashita | |
| 9,704,911 B2 | 7/2017 | Oh | |
| 9,865,635 B2 | 1/2018 | Park et al. | |
| 9,991,299 B2 | 6/2018 | Park et al. | |
| 10,068,937 B2 | 9/2018 | Yang et al. | |
| 2011/0303973 A1* | 12/2011 | Masuoka | H01L 29/42384 257/329 |

(Continued)

FOREIGN PATENT DOCUMENTS

| | | |
|---|---|---|
| JP | 2016-21479 A | 2/2016 |
| JP | 2018-117102 A | 7/2018 |
| JP | 2018-174231 A | 11/2018 |

*Primary Examiner* — Anh D Mai
(74) *Attorney, Agent, or Firm* — Fish & Richardson P.C.

(57) ABSTRACT

An image sensor is disclosed. The image sensor includes a semiconductor substrate, a plurality of pillars protruding from the semiconductor substrate, and spaced from each other, a spacer layer on the semiconductor substrate and a sidewall of each of the plurality of pillars, a plurality of gate structures on the spacer layer, and a plurality of unit pixels arranged in a matrix form. The first unit pixel includes a first photodiode (PD) formed in the semiconductor substrate, a first pillar, a second pillar and a third pillar of the plurality of pillars, and a first gate structure and a second gate structure of the plurality of gate structures. Each of the first pillar and the second pillar includes a first channel region and a first drain region on the first channel region. The third pillar is not surround by any gate structure of the plurality of gate structures.

12 Claims, 33 Drawing Sheets

(56) References Cited

U.S. PATENT DOCUMENTS

| | | | |
|---|---|---|---|
| 2013/0062673 A1* | 3/2013 | Masuoka | H01L 27/14614 257/291 |
| 2013/0307037 A1* | 11/2013 | Masuoka | H01L 29/66545 257/288 |
| 2017/0207263 A1* | 7/2017 | Park | H01L 27/14614 |
| 2018/0151618 A1 | 5/2018 | Tsai | |
| 2019/0363129 A1 | 11/2019 | Yokoyama et al. | |
| 2020/0020728 A1 | 1/2020 | Ammo et al. | |

* cited by examiner

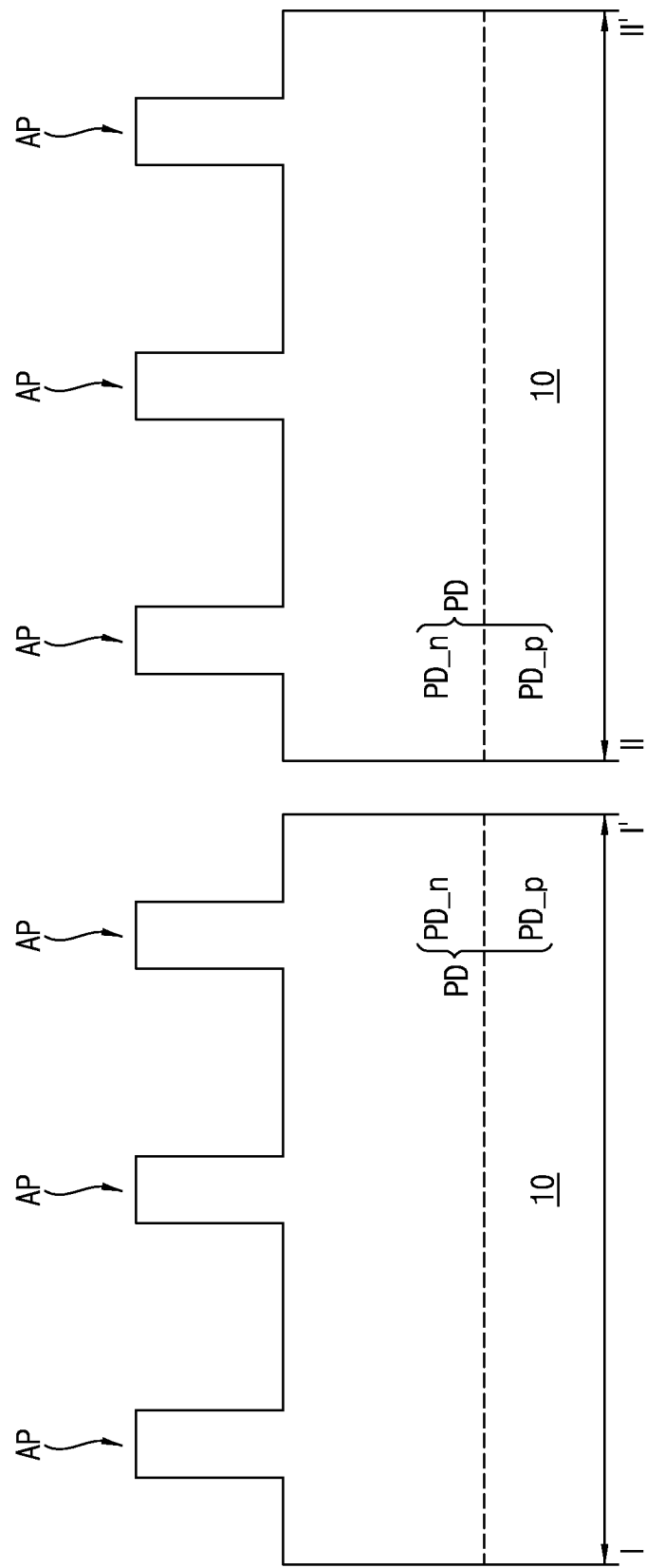

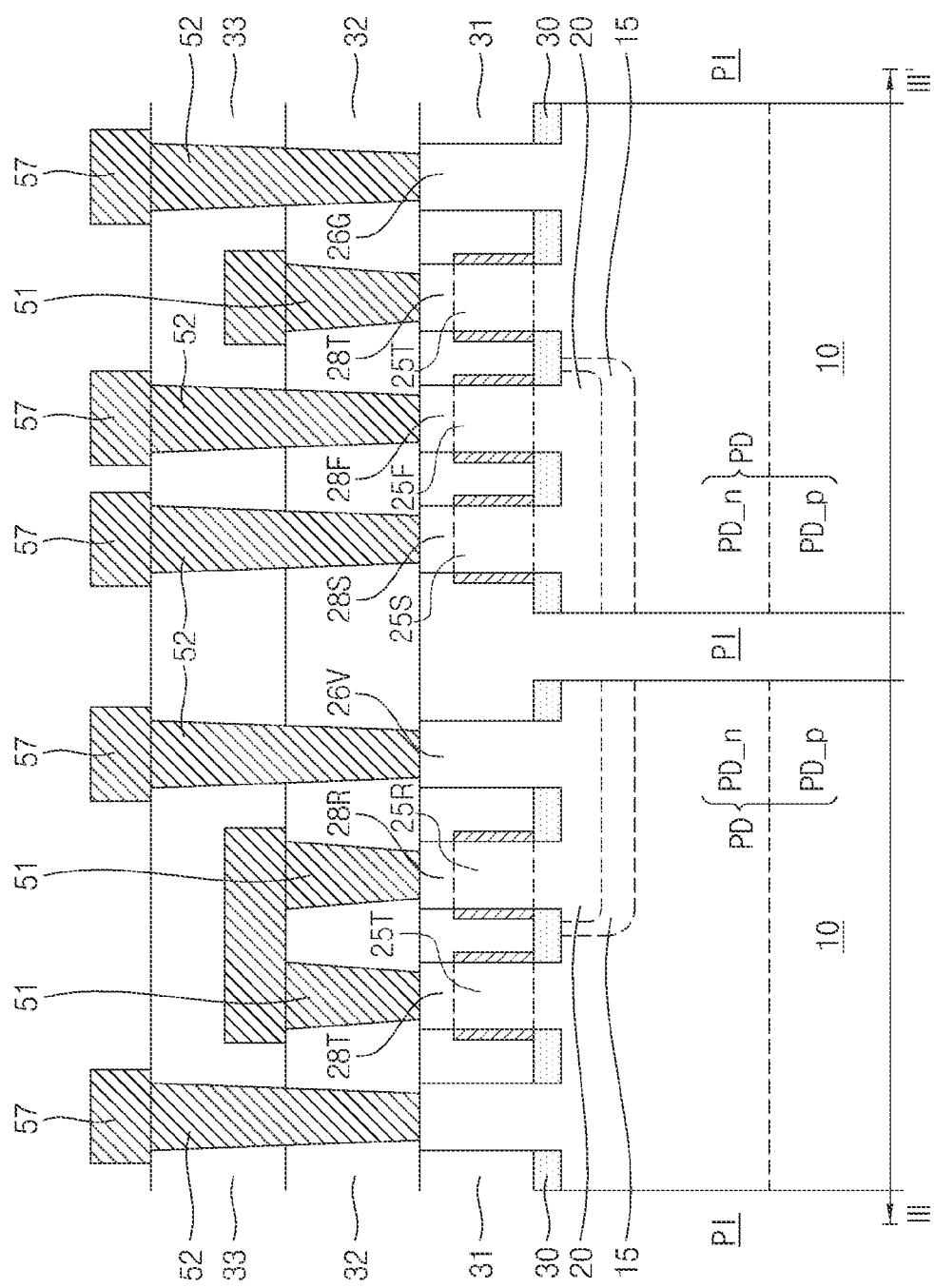

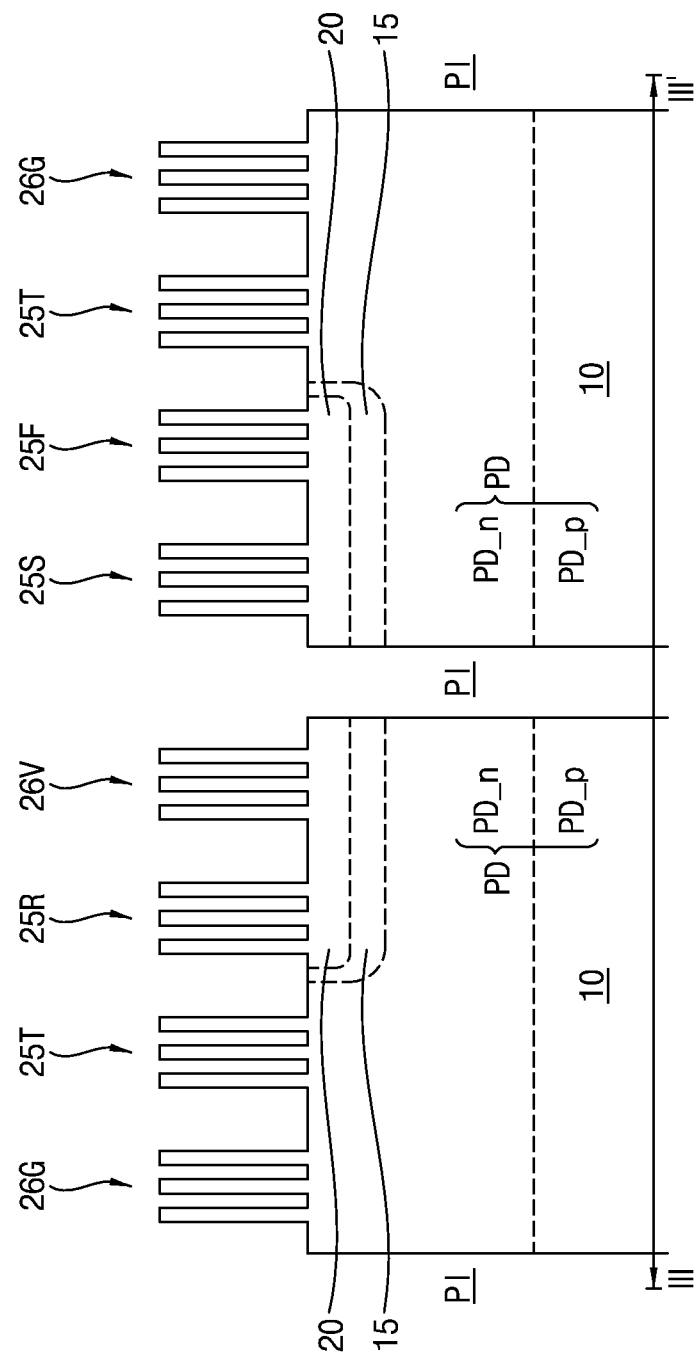

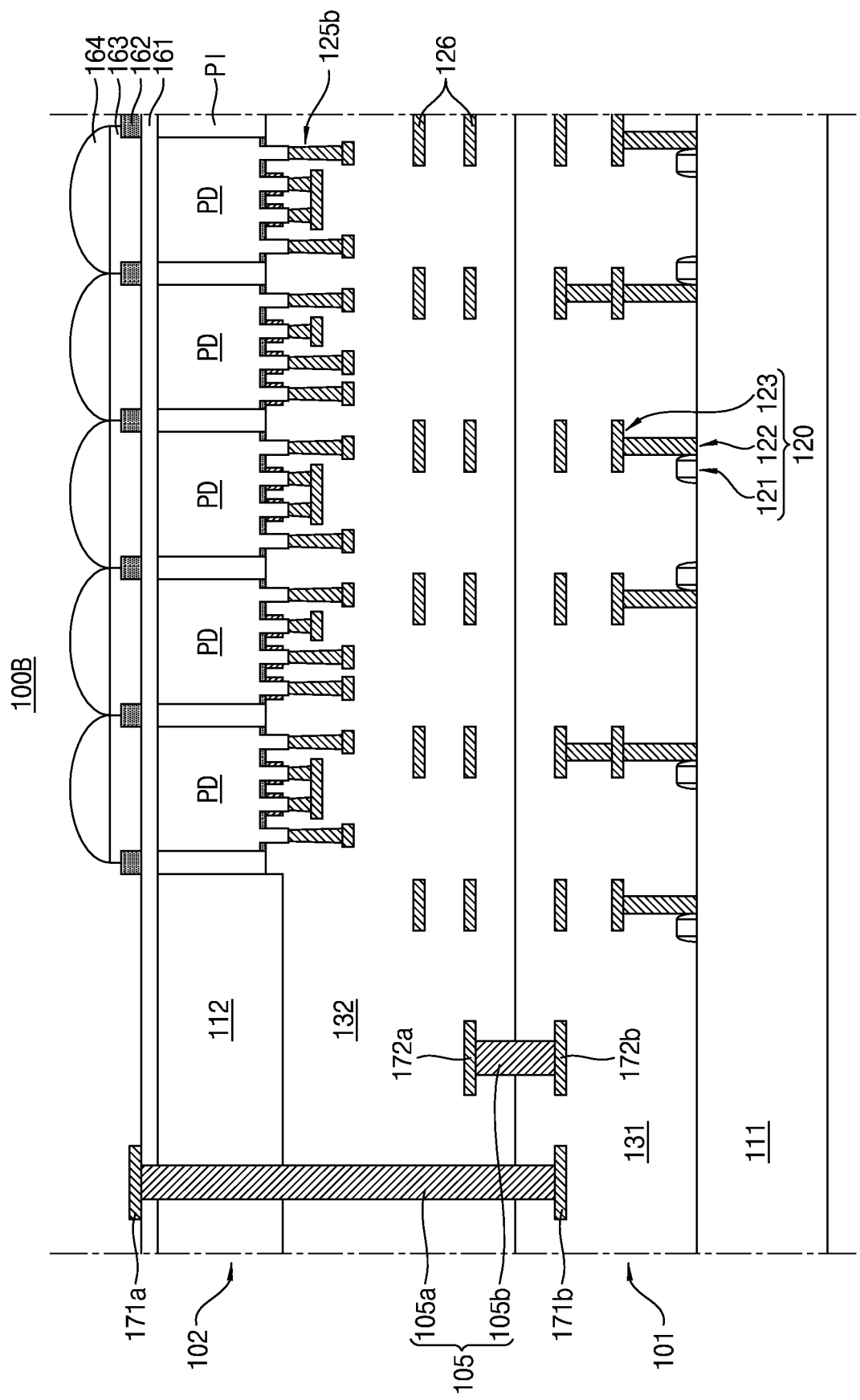

IMAGE SENSOR HAVING VERTICAL, TRANSFER, RESET, SOURCE FOLLOWER, AND SELECT TRANSISTORS VERTICALLY ALIGNED OVER THE PHOTODIODE

CROSS-REFERENCE TO THE RELATED APPLICATION

This application claims priority from Korean Patent Application No. 10-2020-0013689, filed on Feb. 5, 2020 in the Korean Intellectual Property Office, the disclosure of which is incorporated herein by reference in its entirety.

BACKGROUND

1. Field

Methods and apparatuses consistent with example embodiments to an image sensor including a transistor including a protruding channel region.

2. Description of Related Art

As information and communication industries advance and electronic devices are digitized, image sensors are being applied to various fields such as digital cameras, camcorders, portable phones, personal communication system (PCS), game machines, surveillance cameras, and medical micro-cameras.

SUMMARY

One or more example embodiments provide an image sensor including a transistor including a protruding channel region.

One or more example embodiments provide an image sensor in which a transfer transistor, a source follower transistor, a selection transistor, and a reset transistor are integrated into a unit pixel.

Example embodiments will be described in detail below.

According to an example embodiment, an image sensor includes a semiconductor substrate, a plurality of pillars protruding from the semiconductor substrate, and spaced from each other, a spacer layer on the semiconductor substrate and a sidewall of each of the plurality of pillars, a plurality of gate structures on the spacer layer, and a plurality of unit pixels arranged in a matrix form, the plurality of unit pixels comprising a first unit pixel, a second unit pixel, a third unit pixel and a fourth unit pixel. The first unit pixel comprises a first photodiode (PD) formed in the semiconductor substrate, a first pillar, a second pillar and a third pillar of the plurality of pillars, and a first gate structure and a second gate structure of the plurality of gate structures. Each of the first pillar and the second pillar comprises a first channel region and a first drain region on the first channel region. The first gate structure comprises a first gate electrode surrounding a sidewall of the first channel region of the first pillar and a first gate dielectric layer between the first gate electrode and the first channel region of the first pillar. The second gate structure comprises a second gate electrode surrounding a sidewall of the channel region of the second pillar and a second gate dielectric layer between the second gate electrode and the channel region of the second pillar. The third pillar is not surround by any gate structure of the plurality of gate structures.

According to an example embodiment, an image sensor includes a substrate; a first well area and a first source area each formed in the substrate; a plurality of pillars protruding from the substrate, wherein the plurality of pillars comprise a first pillar, a second pillar, a third pillar, and fourth pillar, the each of the first pillar and second pillar comprises a first channel region and a first drain region on the first channel region, a spacer layer on the substrate and a sidewall of each of the plurality of pillars; a plurality of gate structures on the spacer layer, wherein the plurality of gate structures comprise a first gate structure, and a second gate structure, the first gate structure comprises a first gate electrode surrounding a sidewall of the first channel region of the first pillar, and a first gate dielectric layer disposed between the first gate electrode and the first channel region of the first pillar and on the spacer layer, and the second gate structure comprises a second gate electrode surrounding a sidewall of the second channel region of the second pillar, and a second gate dielectric layer disposed between the second gate electrode and the second channel region of the second pillar and on the spacer layer, wherein the third pillar is not surround by any gate structure of the plurality of gate structures, wherein a portion of the first source area vertically overlaps the first channel region of the second pillar, and does not vertically overlaps the first channel region of the first pillar, and wherein the first well area surrounds the first source area; a first lower contact plug on and contacting an upper surface of the first pillar; a second lower contact plug on and contacting an upper surface of the second pillar; a first lower wiring disposed on the first lower contact plug and the second lower contact plug; a source voltage electrode on and contacting an upper surface of the third pillar; and a first ground voltage electrode on and contacting an upper surface of the fourth pillar.

According to an aspect of an example embodiment, an image sensor includes a lower device and an upper device stacked on the lower device. The lower device includes a logic circuit disposed on a lower substrate, the upper device includes a plurality of photodiodes formed in an upper substrate, a plurality of cell circuits disposed on a bottom surface of the upper substrate, and a plurality of color filters disposed on atop surface of the upper substrate, each of the plurality of cell circuits includes a transfer transistor structure, a source follower transistor structure, and a selection transistor structure, the transfer transistor structure of each of the plurality of cell circuits is vertically aligned with one of the plurality of photodiodes, and includes a transfer transistor channel region protruding from the bottom surface of the upper substrate and a transfer transistor gate structure surrounding side surfaces of the transfer transistor channel region, the source follower transistor structure of each of the plurality of cell circuits is vertically aligned with one of the plurality of photodiodes, and includes a source follower transistor channel region protruding from the bottom surface of the upper substrate and a source follower transistor gate structure surrounding side surfaces of the source follower transistor channel region, and the selection transistor structure of each of the plurality of cell circuits is vertically aligned with one of the plurality of photodiodes, and includes a selection transistor channel region protruding from the bottom surface of the upper substrate and a selection transistor gate structure surrounding side surfaces of the selection transistor channel region.

BRIEF DESCRIPTION OF THE DRAWINGS

FIGS. 6A, 6B, 6C, 6D and 6E are vertical cross-sectional views showing a method of manufacturing an image sensor according to an example embodiment.

FIGS. 8A, 8B, 8C, 8D and 8E are vertical cross-sectional views showing a method of manufacturing an image sensor according to an example embodiment.

FIGS. 9A and 9B are vertical cross-sectional views illustrating a plurality of image sensors according to example embodiments.

DETAILED DESCRIPTION

Figure 1:
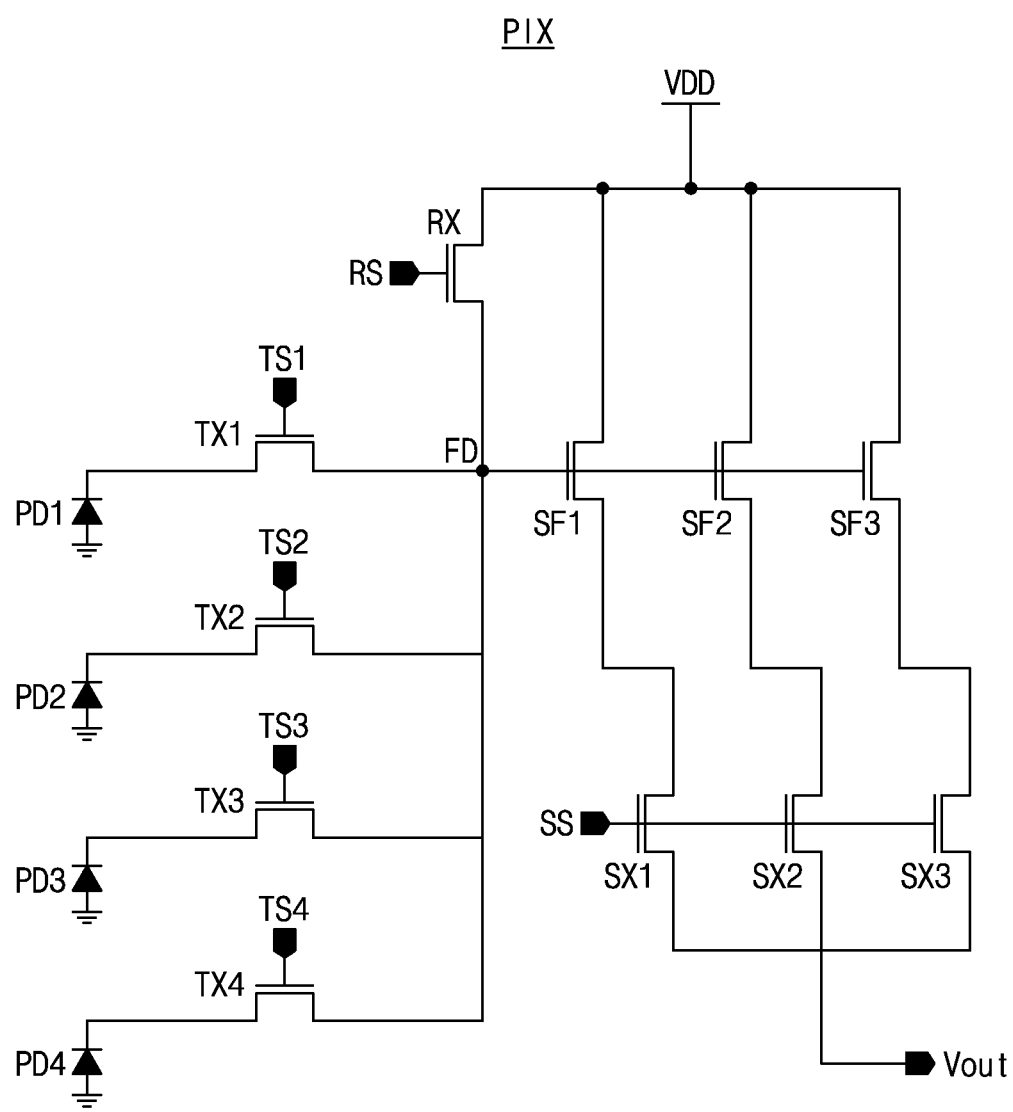
FIG. 1 is an equivalent circuit diagram of a pixel block of an image sensor according to an example embodiment.

FIG. 1 is an equivalent circuit diagram of a pixel block PIX of an image sensor according to an example embodiment. Referring to FIG. 1, the pixel block PIX of the image sensor according to an example embodiment may include first to fourth photodiodes PD1 to PD4, first to fourth transfer transistors TX1 to TX4, common floating diffusion FD, reset transistor RX, first to third source follower transistors SF1 to SF3, and first to third selection transistors SX1 to SX3.

Each of the first to fourth photodiodes PD1 to PD4 may generate photo-charges, such as an electron-hole pair (EHP), based on an amount of light incident thereon.

The first to fourth transfer transistors TX1 to TX4 may be respectively and electrically connected to the first to fourth photodiodes PD1 to PD4. For example, first electrodes of the first to fourth transfer transistors TX1 to TX4 may be respectively, electrically, and directly connected to cathode electrodes n of the first to fourth photodiodes PD1 to PD4. Second electrodes of the first to fourth transfer transistors TX1 to TX4 may be connected to the floating diffusion FD in common. The first to fourth transfer transistors TX1 to TX4 may be turned on by first to fourth transfer signals TS1 to TS4 and may transfer photo-electrons, generated in the first to fourth photodiodes PD1 to PD4, to the floating diffusion FD.

The floating diffusion FD may provide the photo-electrons, transferred from the first to fourth photodiodes PD1 to PD4, to gate electrodes of the first to third source follower transistors SF1 to SF3 in common. The gate electrodes of the first to third source follower transistors SF1 to SF3 may be electrically connected to the floating diffusion FD in common. Therefore, the first to third source follower transistors SF1 to SF3 may be turned on by the photo-electrons provided from the floating diffusion FD. The first to third source follower transistors SF1 to SF3 may be connected to one another in parallel and may be simultaneously activated.

The floating diffusion FD may be electrically connected to a first electrode of the reset transistor RX. A second electrode of the reset transistor RX may be electrically connected to a source voltage VDD. As a reset signal RS is applied to a gate electrode of the reset transistor RX, the reset transistor RX may be turned on. The floating diffusion FD may be reset to a level of the source voltage VDD by the turned-on reset transistor RX.

First electrodes of the first to third source follower transistors SF1 to SF3 may be connected to the source voltage VDD in common. Second electrodes of the first to third source follower transistors SF1 to SF3 may be respectively and electrically connected to first electrodes of the first to third selection transistors SX1 to SX3.

The gate electrodes of the first to third source follower transistors SF1 to SF3 may be electrically connected to one another in common. Also, second electrodes of the first to third selection transistors SX1 to SX3 may be electrically connected to an output port Vout in common. That is, the first to third selection transistors SX1 to SX3 may be connected to one another in parallel and may be simultaneously turned on by a selection signal SS.

Figure 2A:
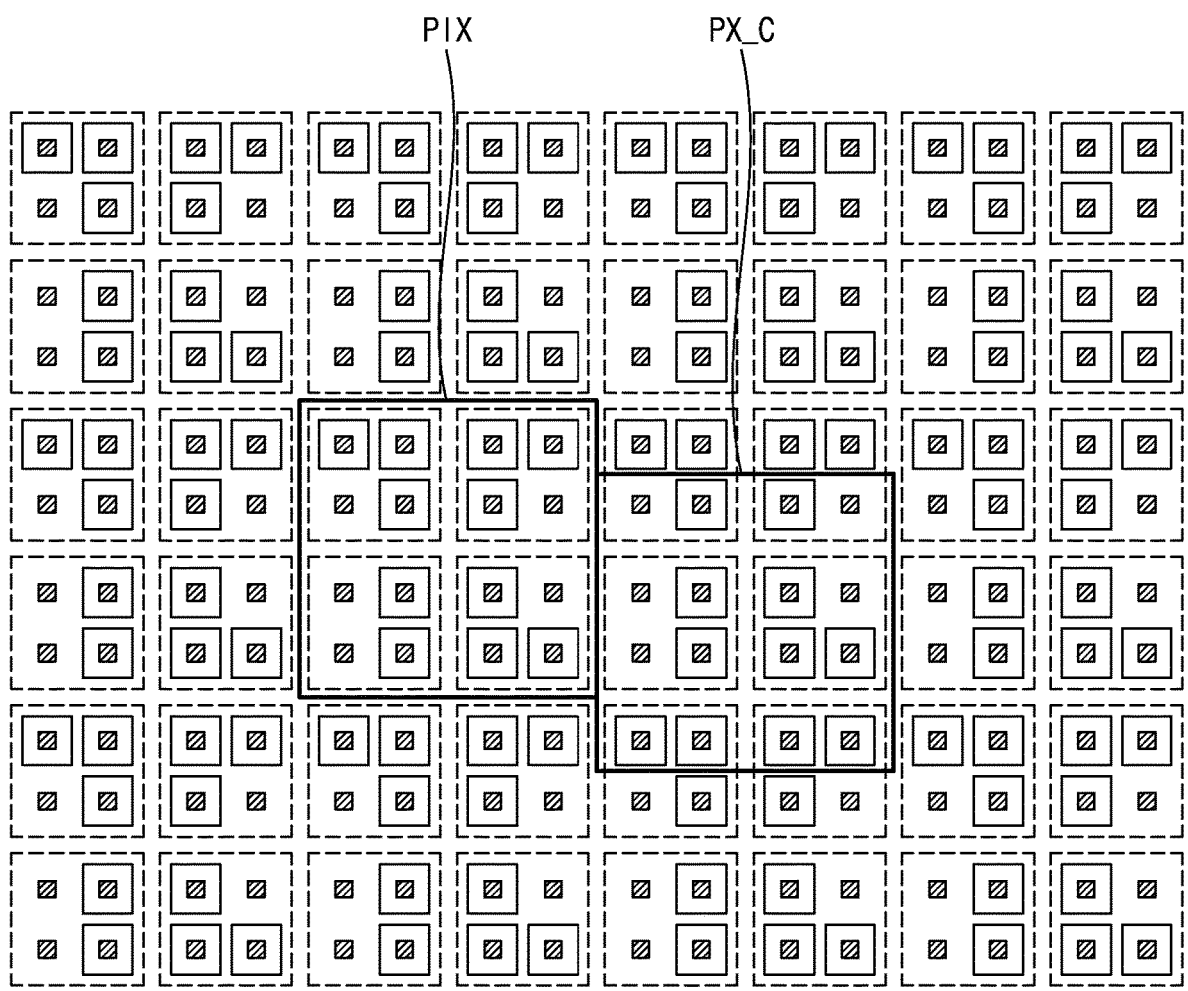
FIG. 2A is a schematic layout of a pixel array of an image sensor according to an example embodiment.
Figure 2B:
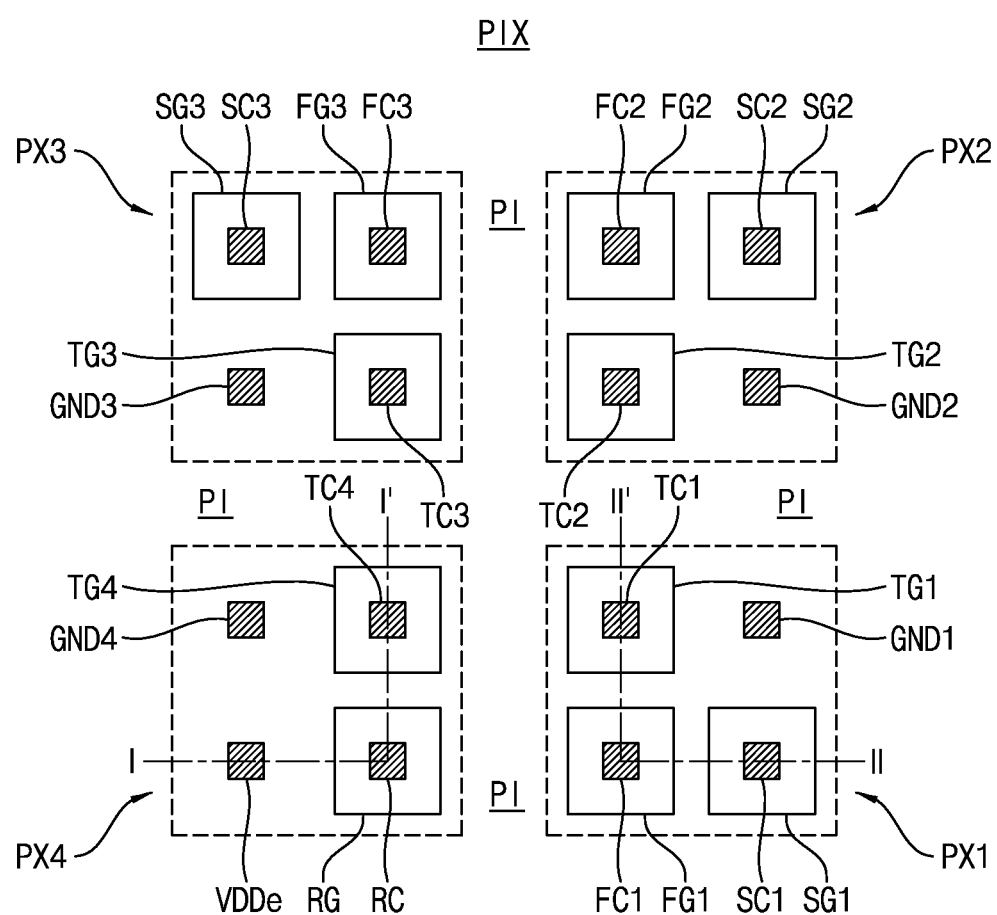
FIGS. 2B, 2C and 2D illustrate pixel blocks according to example embodiments.

FIG. 2A is a schematic layout of a pixel array PA of an image sensor according to an example embodiment, and FIG. 2B is an enlarged view of a pixel block PIX of FIG. 2A.

Referring to FIGS. 2A and 2B, the pixel array PA of the image sensor according to an example embodiment may include a plurality of pixel blocks PIX arranged in a matrix form, and one pixel block PIX may include first to fourth unit pixels PX1 to PX4 arranged in a matrix form. The first to fourth unit pixels PX1 to PX4 may be defined by a plurality of pixel isolation areas PI. The image sensor according to the present example embodiment may be a backside illuminated image sensor, and the first to fourth unit pixels PX1 to PX4 may respectively include first to fourth photodiodes.

The first unit pixel PX1 may include a plurality of first transfer transistor structures, a plurality of first source follower transistor structures, a plurality of first selection transistor structures, and a first ground voltage electrode, which are arranged in a matrix form. The plurality of first transfer transistor structures may include a first transfer transistor channel region TC1 and a first transfer transistor gate electrode TG1. The first transfer transistor gate electrode TG1 may surround the first transfer transistor channel region TC1. The plurality of first source follower transistor structures may include a first source follower transistor channel region FC1 and a first source follower transistor gate electrode FG1. The first source follower transistor gate electrode FG1 may surround the first source follower transistor channel region FC1. The plurality of first selection transistor structures may include a first selection transistor channel region SC1 and a first selection transistor gate electrode SG1. The first selection transistor gate electrode SG1 may surround the first selection transistor channel region SC1.

The second unit pixel PX2 may include a plurality of second transfer transistor structures, a plurality of second source follower transistor structures, a plurality of second selection transistor structures, and a second ground voltage electrode, which are arranged in a matrix form. The plurality of second transfer transistor structures may include a second transfer transistor channel region TC2 and a second transfer transistor gate electrode TG2. The second transfer transistor gate electrode TG2 may surround the second transfer transistor channel region TC2. The plurality of second source follower transistor structures may include a second source follower transistor channel region FC2 and a second source follower transistor gate electrode FG2. The second source follower transistor gate electrode FG2 may surround the second source follower transistor channel region FC2. The plurality of second selection transistor structures may include a second selection transistor channel region SC2 and a second selection transistor gate electrode SG2. The second selection transistor gate electrode SG2 may surround the second selection transistor channel region SC2.

The third unit pixel PX3 may include a plurality of third transfer transistor structures, a plurality of third source follower transistor structures, a plurality of third selection transistor structures SC3, and a third ground voltage electrode, which are arranged in a matrix form. The plurality of third transfer transistor structures may include a third transfer transistor channel region TC3 and a third transfer transistor gate electrode TG3. The third transfer transistor gate electrode TG3 may surround the third transfer transistor channel region TC3. The plurality of third source follower transistor structures may include a third source follower transistor channel region FC3 and a third source follower transistor gate electrode FG3. The third source follower transistor gate electrode FG3 may surround the third source follower transistor channel region FC3. The plurality of third selection transistor structures may include a third selection transistor channel region SC3 and a third selection transistor gate electrode SG3. The third selection transistor gate electrode SG3 may surround the third selection transistor channel region SC3.

The fourth unit pixel PX4 may include a plurality of fourth transfer transistor structures, a plurality of reset transistor structures, a fourth ground voltage electrode, and a source voltage electrode, which are arranged in a matrix form.

The plurality of fourth transfer transistor structures may include a fourth transfer transistor channel region TC4 and a fourth transfer transistor gate electrode TG4. The fourth transfer transistor gate electrode TG4 may surround the fourth transfer transistor channel region TC4. The plurality of reset transistor structures may include a reset transistor channel region RC and a reset transistor gate electrode RG. The reset transistor gate electrode RG may surround the reset transistor channel region RC.

For example, three unit pixels PX1 to PX3, from among four unit pixels PX1 to PX4, may respectively include a plurality of transfer transistor structures TC1 to TC3 and TG1 to TG3, a plurality of source follower transistor structures FC1 to FC3 and FG1 to FG3, a plurality of selection transistor structures SC1 to SC3 and SG1 to SG3, and a plurality of ground voltage electrodes GND1 to GND3, and one unit pixel PX4 may include a plurality of transfer transistor structures TC4 and TG4, a plurality of reset transistor structures RC and RG, a ground voltage electrode GND4, and a source voltage electrode VDDe.

The first to fourth transfer transistor structures TC1 to TC4 and TG1 to TG4, the first to third source follower transistor structures FC1 to FC3 and FG1 to FG3, the first to third selection transistor structures SC1 to SC3 and SG1 to SG3, and the reset transistor structures RC and RG may each have a square shape. For example, the first to fourth transfer transistor channel regions TC to TC4, the first to third source follower transistor channel regions FC1 to FC3, the first to third selection transistor channel regions SC1 to SC3, and the reset transistor channel region RC may each have a square shape. The first to fourth transfer transistor gate electrodes TG1 to TG4, the first to third source follower transistor gate electrodes FG1 to FG3, the first to third selection transistor gate electrodes SG1 to SG3, and the reset transistor gate electrode RG may each have a tetragonal disk shape or a frame shape. In addition, the first to fourth ground voltage electrodes GND1 to GND4 and the source voltage electrode VDDe may each have a square shape.

In the present example embodiment, positions of the first to fourth unit pixels PX1 to PX4 may be variously changed. Also, in one of the first to fourth unit pixels PX1 to PX4, positions of the first to fourth transfer transistor structures TC1 to TC4 and TG1 to TG4, the first to third source follower transistor structures FC1 to FC3 and FG1 to FG3, the first to third selection transistor structures SC1 to SC3 and SG1 to SG3, the reset transistor structures RC and RG, the first to fourth ground voltage electrodes GND1 to GND4 and the source voltage electrode VDDe may be variously changed.

Figure 2C:
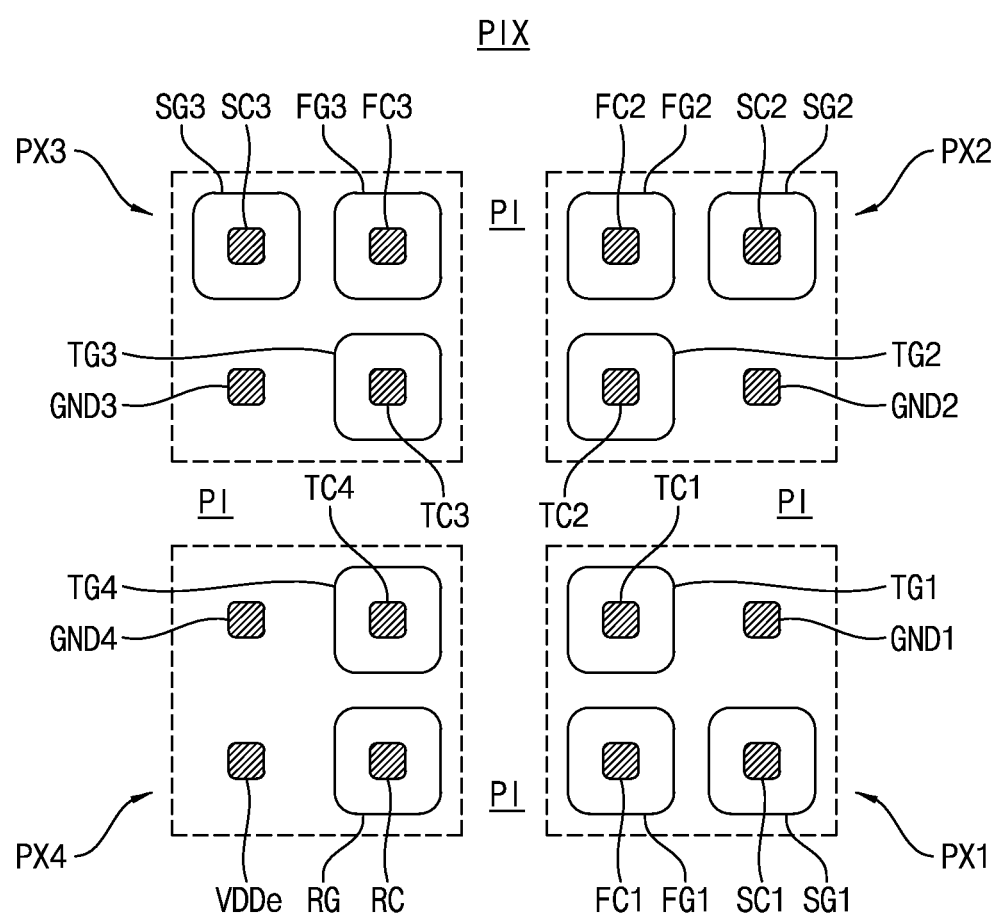
Figure 2D:
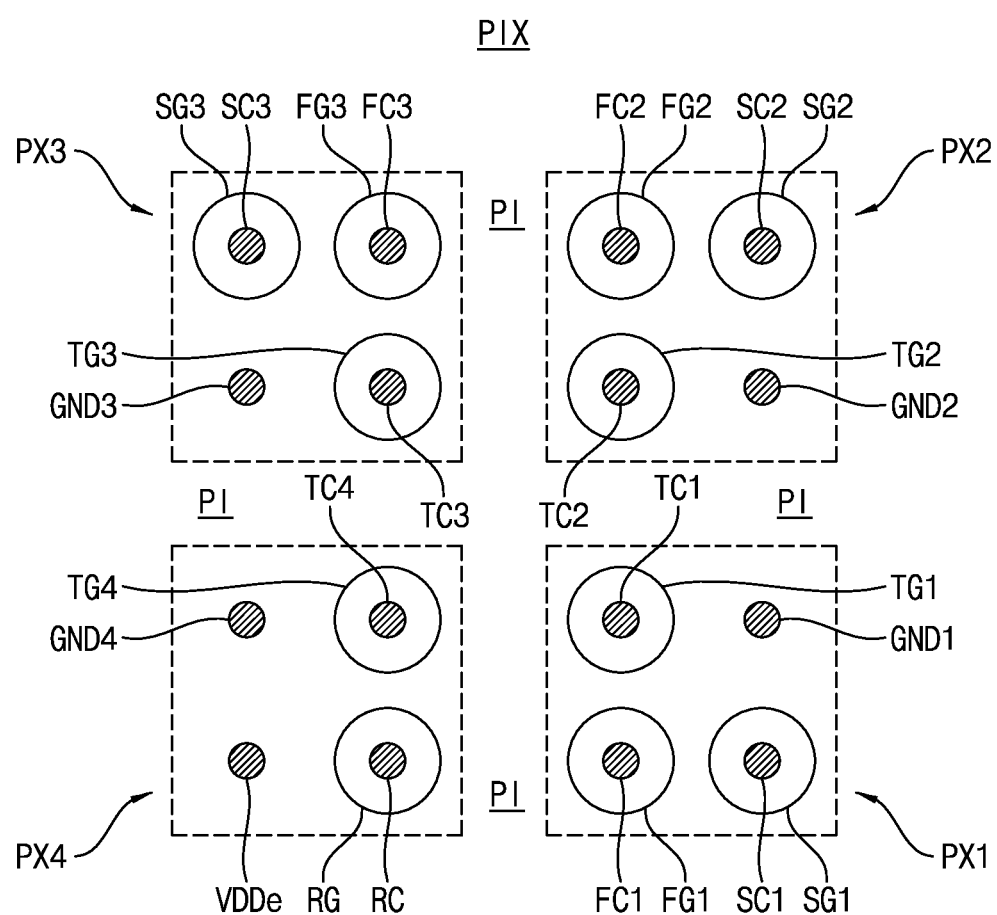

FIGS. 2C and 2D illustrate pixel blocks PIX according to other example embodiments. Referring to FIG. 2C, comparing with the pixel block PIX of FIG. 2B, a plurality of channel regions TC1 to TC4, FC1 to FC3, SC1 to SC3, and RC, a plurality of ground voltage electrodes GND1 to GND4, and a source voltage electrode VDDe may each include a plurality of round corner portions. Also, a plurality of gate electrodes TG1 to TG4, FG1 to FG3, SG1 to SG3, and RG may each include a plurality of round corner portions. Referring to FIG. 2D, comparing with the pixel block PIX of FIG. 2B, the plurality of channel regions TC1 to TC4, FC1 to FC3, SC1 to SC3, and RC, the plurality of ground voltage electrodes GND1 to GND4, and the source voltage electrode VDDe may each have a circular shape, and moreover, the plurality of gate electrodes TG1 to TG4, FG1 to FG3, SG1 to SG3, and RG may each have a circular disk shape. The elements may not include a plurality of sharp portions and may each include a plurality of circular outer surfaces or round corner portions, and thus, an electric field may be prevented from concentrating on the sharp portions.

Vertical cross-sectional surfaces of the pixel block PIX of the image sensor according to various example embodiments illustrated in FIGS. 2A to 2D will be described below with reference to FIGS. 3A to 3I.

FIGS. 3A to 3I are vertical cross-sectional views taken along lines I-I' and II-II' of FIG. 2B, for describing a method of manufacturing an image sensor according to an example embodiment.

Referring to FIG. 3A, the method of manufacturing an image sensor according to an example embodiment may include a process of forming a plurality of photodiodes PD in a substrate 10 through an ion injection process and a process of forming a plurality of active areas AP through a recess process. Referring to FIGS. 2A to 2D, the first to fourth unit pixels PX1 to PX4 may respectively include first to fourth photodiodes PD.

Each of the plurality of photodiodes PD may include a P-type area PD_p and an N-type area PD_n. The process of forming the photodiodes PD may include a process of performing the ion injection process. For example, a left photodiode PD may be the fourth photodiode PD of the fourth unit pixel PX4, and a right photodiode PD may be the first photodiode PD of the first unit pixel PX1. The recess process may include a process of selectively removing an upper portion of the substrate 10 through a selective etching process. Based on the recess process, the plurality of active areas AP may be formed in a plurality of pillar shapes in the N-type area PD_n of the photodiode PD of each of the first to fourth unit pixels PX1 to PX4. That is, the plurality of active areas AP may have a pillar shape protruding from a surface of the substrate 10 (for example, a surface of the N-type area PD_n of the photodiode PD).

Figure 3B:
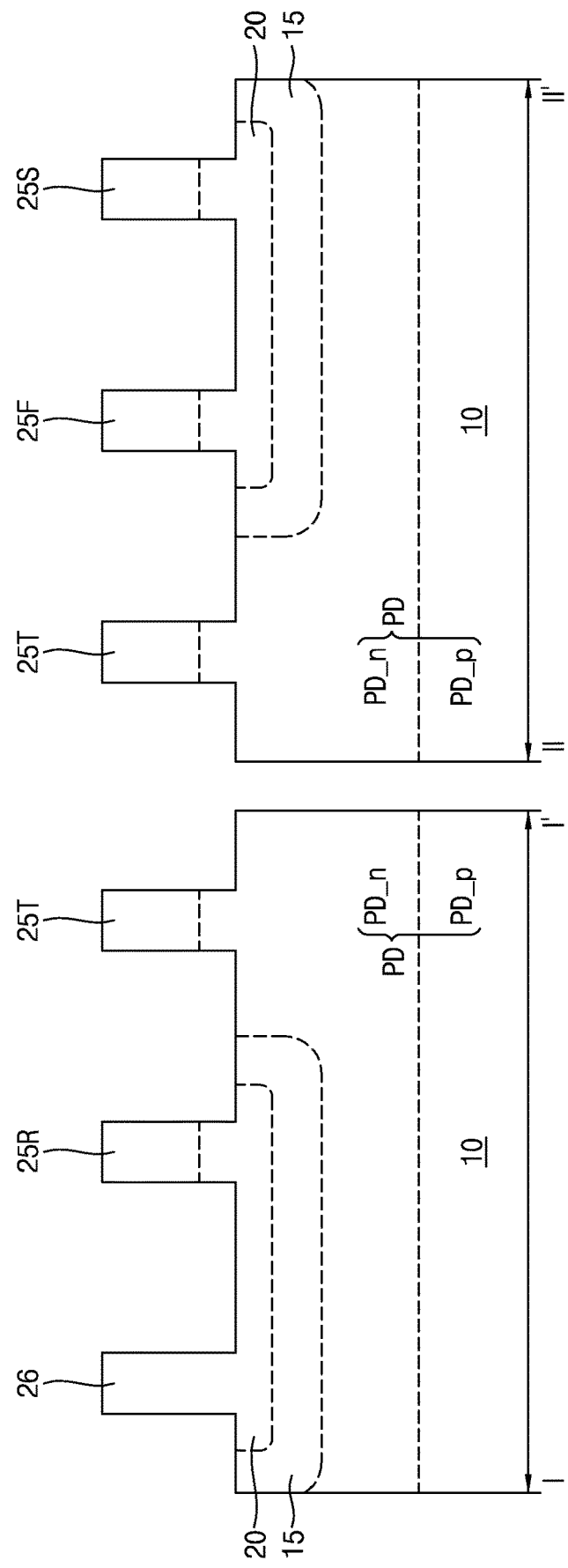
FIGS. 3A, 3B, 3C, 3D, 3E, 3F, 3G. 3H and 3I are vertical cross-sectional views showing a method of manufacturing an image sensor according to an example embodiment.

Referring to FIG. 3B, the method may include a process of forming a plurality of well areas 15, a plurality of source areas 20, a plurality of channel areas 25R, 25T, 25F, and 25S, and an electrode area 26 by performing ion injection processes. For example, the ion injection processes may include a first ion injection process of forming the plurality of well areas 15, a second ion injection process of forming the plurality of source areas 20, and a third ion injection process of forming the plurality of channel areas 25R, 25T, 25F, and 25S. The plurality of well areas 15 may be formed by the first ion injection process, the plurality of source areas 20 may be formed by the second ion injection process, and the plurality of channel areas 25R, 25T, 25F, and 25S may be formed by the third ion injection process. The first ion injection process may include a process of injecting a P-type ion such as boron (B), the second ion injection process may include a process of injecting an N-type ion such as phosphorous (P) and/or arsenic (As), and the third ion injection process may include a process of injecting a P-type ion such as boron (B). The first ion injection process and the second ion injection process may include an inclined ion injection process. The plurality of channel areas 25R, 25T. 25F, and 25S may include a reset transistor channel area 25R, a transfer transistor channel area 25T, a source follower transistor channel area 25F, and a selection transistor channel area 25S. That is, the plurality of channel areas 25R, 25T, 25F, and 25S and the electrode area 26 may have a pillar shape protruding from the surface of the substrate 10 (for example, the surface of the N-type area PD_n of the photodiode PD).

The well area 15 and the source area 20 may be formed under the source voltage electrode VDDe, the reset transistor channel area 25R, the source follower transistor channel area 25F, and the selection transistor channel area 25S. The well area 15 and the source area 20 may not be formed under the transfer transistor channel area 25T. The well area 15 may surround a lower portion and side surfaces of the source area 20. Therefore, the well area 15 may electrically insulate the source area 20 from the photodiode PD. The transfer transistor channel area 25T and the N-type area PD_n of the photodiode PD may form a P-N junction.

Figure 3C:
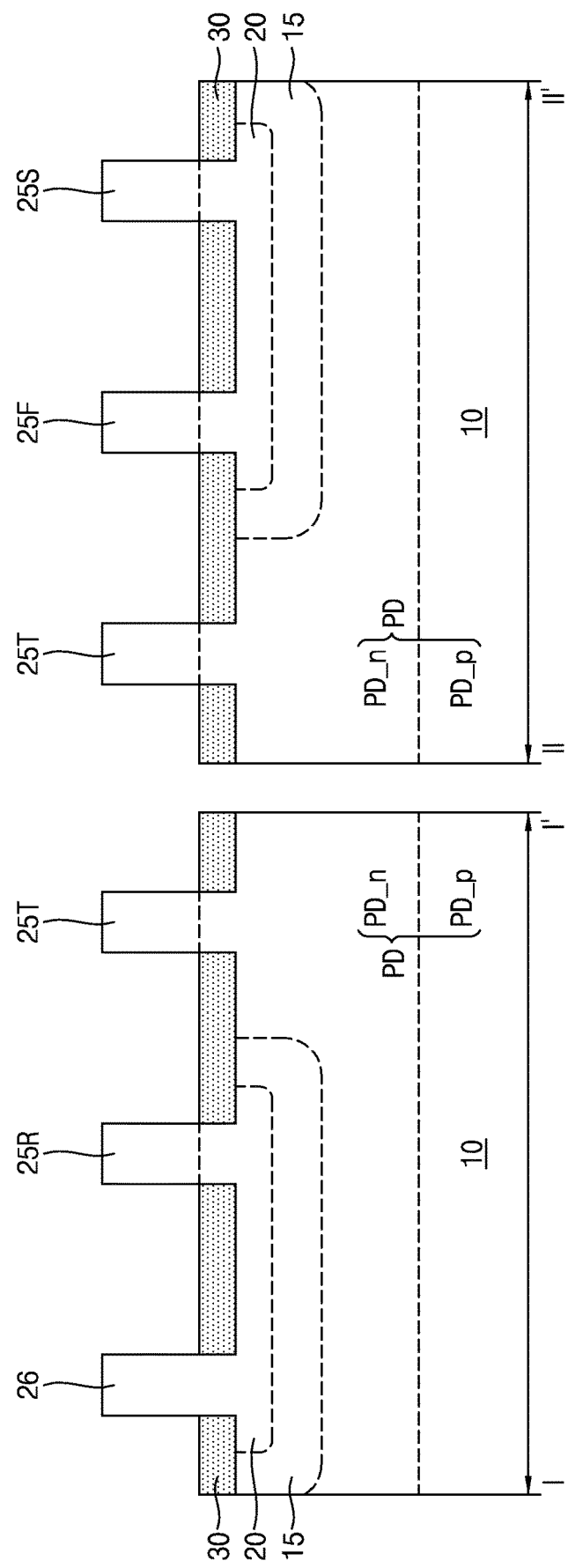

Referring to FIG. 3C, the method may include a process of forming a spacer layer 30 for insulation. The spacer layer 30 may cover a surface of the substrate 10 exposed between the electrode area 26 and the channel areas 25R, 25T, 25F, and 25S and lower side surfaces of the electrode area 26 and the channel areas 25R, 25T, 25F, and 25S. The spacer layer 30 may include silicon oxide, silicon nitride, or other insulating materials. The process of forming the spacer layer 30 may include a process of wholly forming a spacer material layer through a deposition process or a coating process, and then, partially removing an upper portion of the spacer material layer through a recess process such as an etch-back process.

Figure 3D:
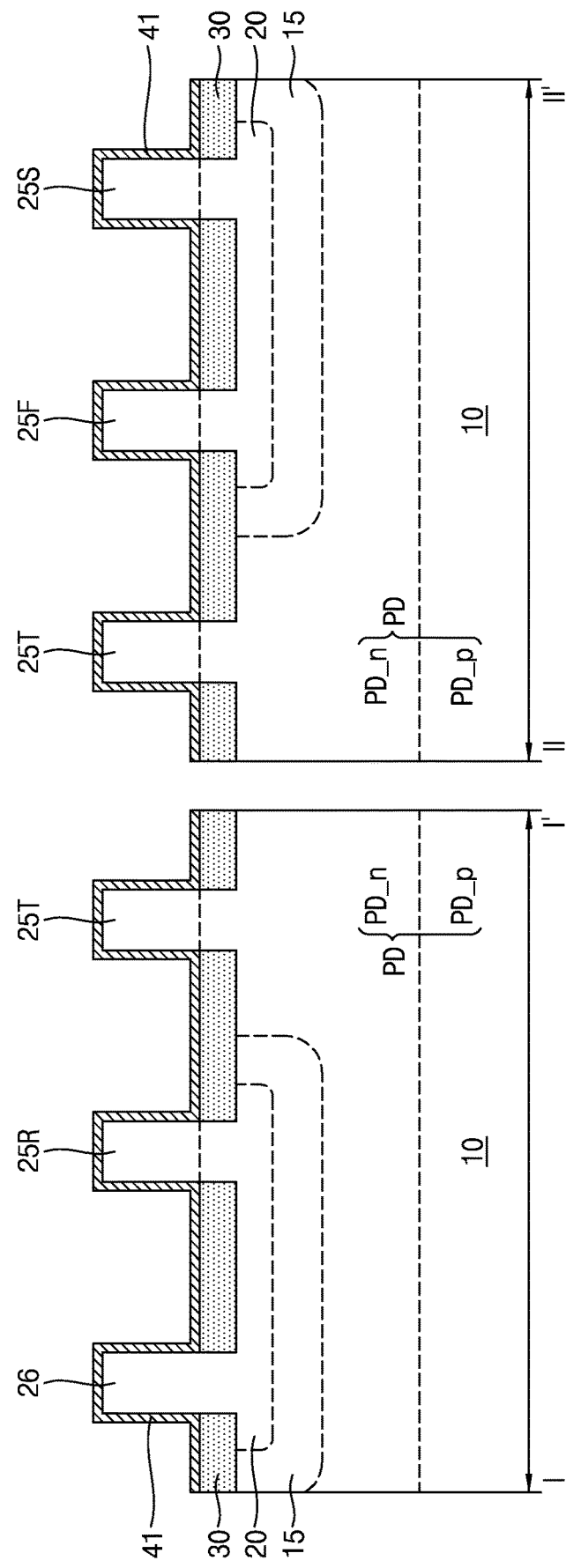

Referring to FIG. 3D, the method may include a process of wholly forming a gate insulation material layer 41 through a deposition process. The gate insulation material layer 41 may be conformally formed on top surfaces and side surfaces of the electrode area 26 and the channel areas 25R, 25T, 25F, and 25S and top surfaces of the spacer layer 30. The gate insulation material layer 41 may include silicon oxide or metal oxide such as hafnium oxide.

Figure 3E:
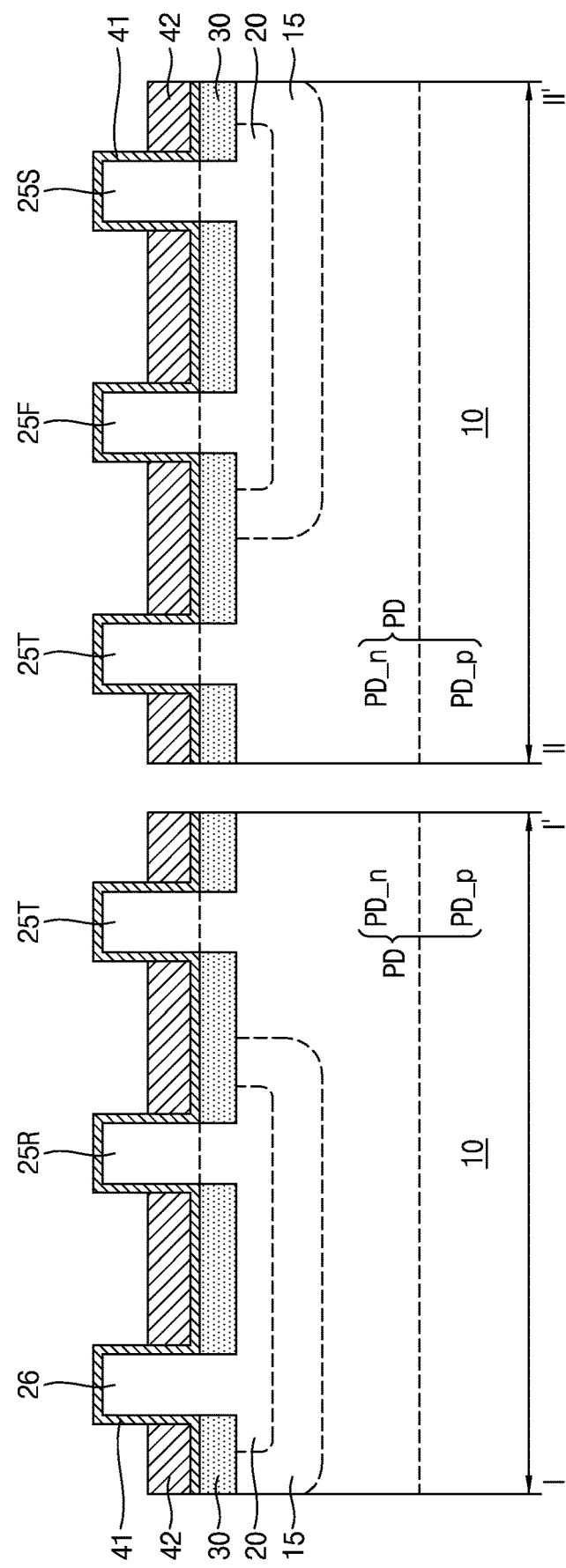

Referring to FIG. 3E, the method may include a process of forming a gate electrode material layer 42. The process of forming the gate electrode material layer 42 may include a process of wholly forming a gate electrode material through a deposition process, and then, partially removing an upper portion of the gate electrode material through a recess process such as an etch-back process. The gate insulation material layer 41 may remain on surfaces of upper portions of the electrode area 26 and the channel areas 25R, 25T, 25F, and 25S. In an example embodiment, the gate insulation material layer 41 on top surfaces of the electrode area 26 and the channel areas 25R, 25T, 25F, and 25S may be removed. For example, upper portions of the electrode area 26 and the channel areas 25R, 25T, 25F, and 25S may be exposed.

Figure 3F:
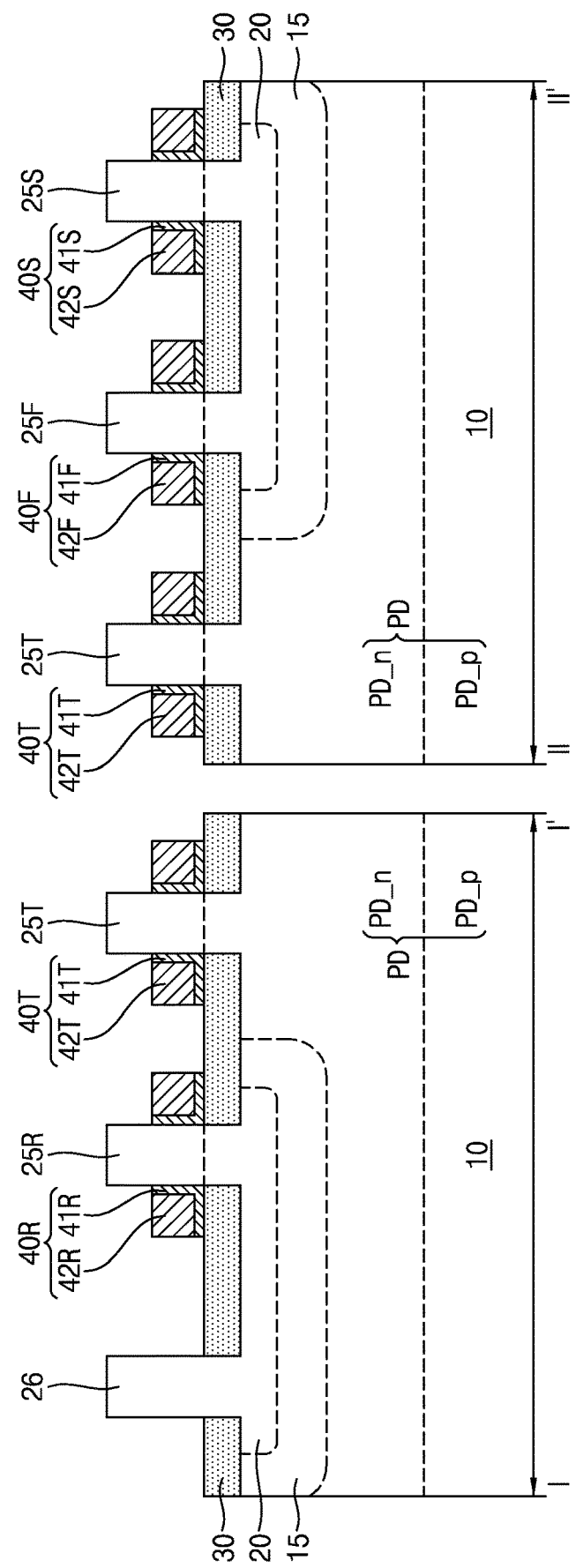

Referring to FIG. 3F, the method may include a process of forming a plurality of gate structures through a patterning process. The patterning process may include a process of selectively etching and patterning the gate electrode material layer 42 and the gate insulation material layer 41.

The plurality of gate structures may include a reset transistor gate structure 40R, a transfer transistor gate structure 40T, a source follower transistor gate structure 40F, and a selection transistor gate structure 40S. The reset transistor gate structure 40R may include a reset transistor gate insulation layer 41R and a reset transistor gate electrode 42R. The transfer transistor gate structure 40T may include a transfer transistor gate insulation layer 41T and a transfer transistor gate electrode 42T. The source follower transistor gate structure 40F may include a source follower transistor gate insulation layer 41F and a source follower transistor gate electrode 42F. The selection transistor gate structure 40S may include a selection transistor gate insulation layer 41S and a selection transistor gate electrode 42S.

The plurality of gate structures 40R, 40T, 40F, and 40S may respectively surround lower portions of the channel areas 25R, 25T, 25F, and 25S. For example, upper portions of the channel areas 25R, 25T, 25F, and 25S may not be surrounded by the gate structures 40R, 40T, 40F, and 40S.

Therefore, in the channel areas 25R, 25T, 25F, and 25S, a charge movement path of an electric charge may be vertically formed. That is, the gate structures 40R, 40T, 40F, and 40S may have a vertical channel structure.

The gate insulation layers 41R, 41T, 41F, and 41S may respectively surround one side surfaces and bottom surfaces of the gate electrodes 42R, 42T, 42F, and 42S. For example, the gate insulation layers 41R, 41T, 41F, and 41S may cover lower side surfaces of the channel areas 25R, 25T, 25F, and 25S and a portion of a top surface of the spacer layer 30. In a vertical cross-sectional view, the gate insulation layers 41R, 41T, 41F, and 41S may have an elbow shape (for example, an L-shape). Therefore, the charge movement path may include bulk-conducting. In detail, electric charges may vertically move through centers of the channel areas 25R, 25T, 25F, and 25S without being adjacent to the gate insulation layers 41R, 41T, 41F, and 41S. Since an attraction is applied horizontally and uniformly, the electric charges may vertically move along a center axis of each of the channel areas 25R, 25T, 25F, and 25S without concentrating on one side.

In a top view, referring further to FIGS. 2B to 2D, the gate structures 40R, 40T. 40F, and 40S may have the same shapes as those of the reset transistor gate electrode RG, the transfer transistor gate electrodes TG1 to TG4, the source follower transistor gate electrodes SF1 to SF3, and the selection transistor gate electrodes SG1 to SG3.

Figure 3G:
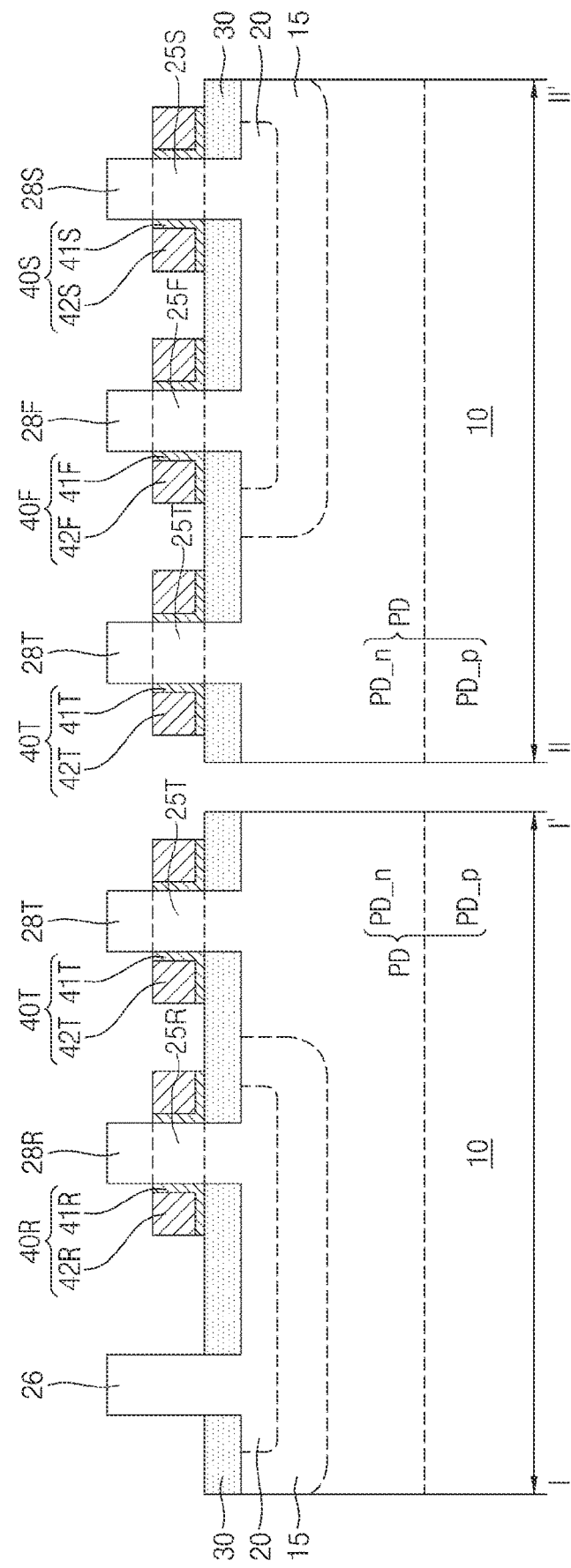

Referring to FIG. 3G, the method may include a process of forming a plurality of drain areas. For example, drain areas 28R, 28T, 28F, and 28S may be formed on the each of the upper portions of the channel areas 25R, 25T, 25F, and 25S. The drain areas 28R, 28T, 28F, and 28S may include a reset transistor drain area 28R, a transfer transistor drain area 28T, a source follower transistor drain area 28F, and a selection transistor drain area 28S. In an example embodiment, the process of forming the plurality of drain areas 28R, 28T, 28F, and 28S may include a process of performing an ion injection process. The ion injection process may include a process of injecting N-type ions such as phosphorous (P) and/or arsenic (As). In an example embodiment, the process of forming the plurality of drain areas 28R, 28T, 28F, and 28S may include a process of forming a silicide area. Therefore, the drain areas 28R, 28T, 28F, and 28S may include metal silicide. The channel areas 25R, 25T, 25F, and 25S and the drain areas 28R, 28T, 28F, and 28S may form a P-N junction. Also, the electrode area 26 may include metal silicide.

Referring further to FIGS. 2A to 2D, the transistor structures disposed in the unit pixels PX1 to PX4 of the pixel block PIX of the image sensor according to an example embodiment may include a plurality of vertical channel regions TC1 to TC4, FC1 to FC3, SC1 to SC3, and RC and a plurality of gate electrodes TG1 to TG4, FG1 to FG3, SG1 to SG3, and RG surrounding side surfaces of the vertical channel regions TC1 to TC4, FC1 to FC3, SC1 to SC3, and RC. The vertical channel regions TC1 to TC4, FC1 to FC3, SC1 to SC3, and RC may include a plurality of source areas stacked vertically, a plurality of channel areas on the source areas, and a plurality of drain areas on the channel areas.

The transistor structures TC1 to TC4, TG1 to TG4, FC1 to FC3, FG1 to FG3, SC1 to SC3, SG1 to SG3, RC, and RG may vertically overlap the photodiodes PD. For example, the transistor structures TC1 to TC4, TG1 to TG4, FC1 to FC3, FG1 to FG3, SC1 to SC3, SG1 to SG3, RC, and RG may be formed in the N-type areas PD_n of the photodiodes PD.

Figure 3H:
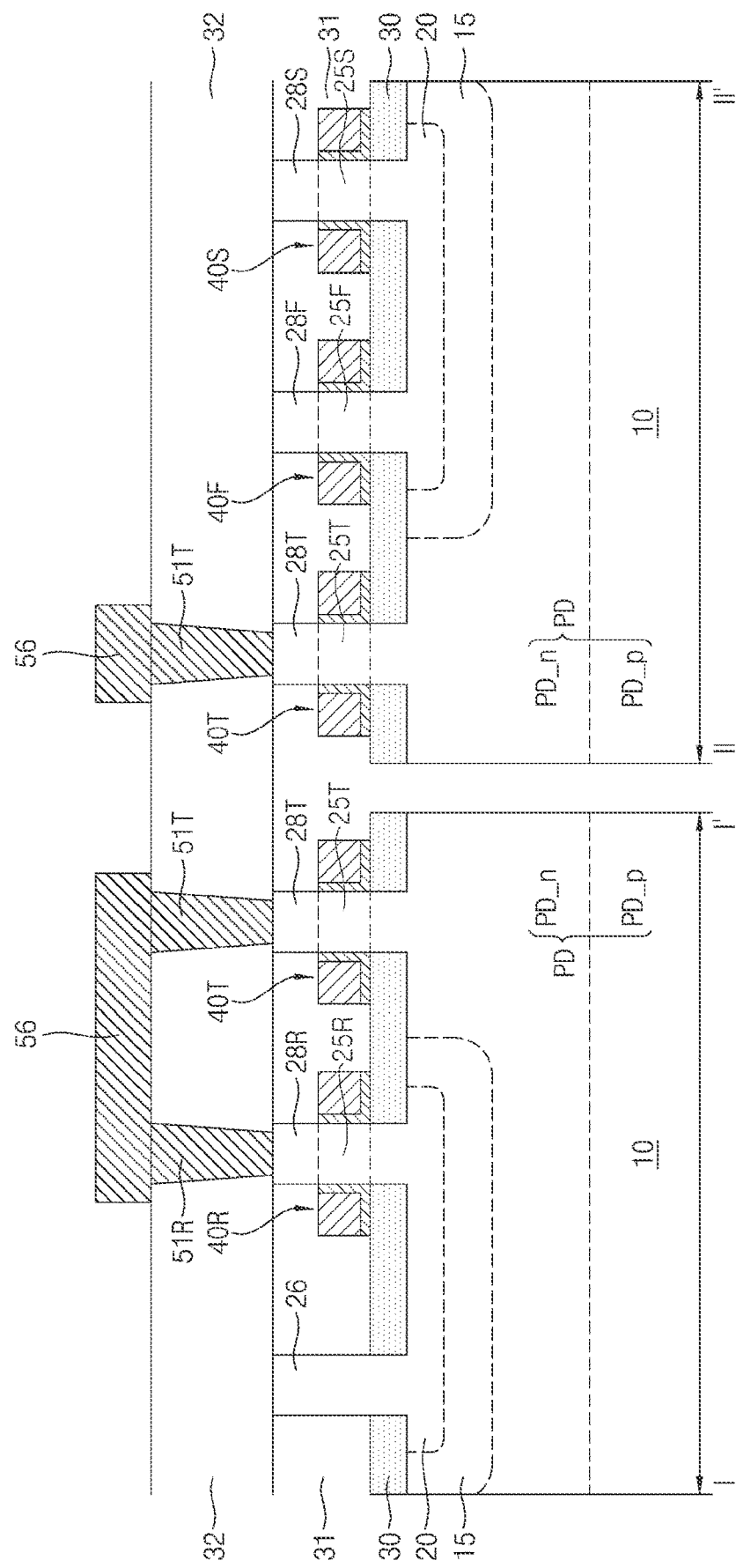

Referring to FIG. 3H, the method may include a process of forming a lower interlayer insulation layer 31, a middle interlayer insulation layer 32, a plurality of lower contact plugs 51R and 51T, and a plurality of lower wirings 56.

The lower interlayer insulation layer 31 may surround the gate structures 40R, 40T, 40F, and 40S and may cover side surfaces of the electrode area 26 and the drain areas 28R, 28T, 28F, and 28S. The middle interlayer insulation layer 32 may be formed on the lower interlayer insulation layer 31 and the drain areas 28R 28T, 28F, and 28S. The lower interlayer insulation layer 31 and the middle interlayer insulation layer 32 may include silicon oxide, silicon nitride, or other insulating materials.

The lower contact plugs 51R and 51T may vertically pass through the middle interlayer insulation layer 32 and may be connected to the drain areas 28R and 28T corresponding thereto. The lower contact plugs 51R and 51T may include a reset contact plug 51R and a transfer contact plug 51T.

The lower wirings 56 may be formed on the middle interlayer insulation layer 32 so as to be connected to the lower contact plugs 51R and 51T. For example, the lower wirings 56 may connect the reset contact plug 51R to the transfer contact plug 51T. A connection shape of the lower wirings 56 may be conceptual. For example, in a vertical cross-sectional surface taken along lines I-I' and II-II' of FIG. 2B, shapes of the lower wirings 56 may be differently seen. The drawings show that the reset contact plug 51R is electrically connected to the transfer contact plug 51T by the lower wiring 56.

The transfer transistor drain area 28T, the reset transistor drain area 28R, the transfer contact plug 51T, the reset contact plug 51R, and the lower wiring 26 may form a floating diffusion. The floating diffusion according to the present example embodiment may provide a full well capac-ity (FWC) which is sufficiently large. Accordingly, a color resolution of the image sensor may sufficiently increase, and color implementation performance may be enhanced.

Figure 3I:
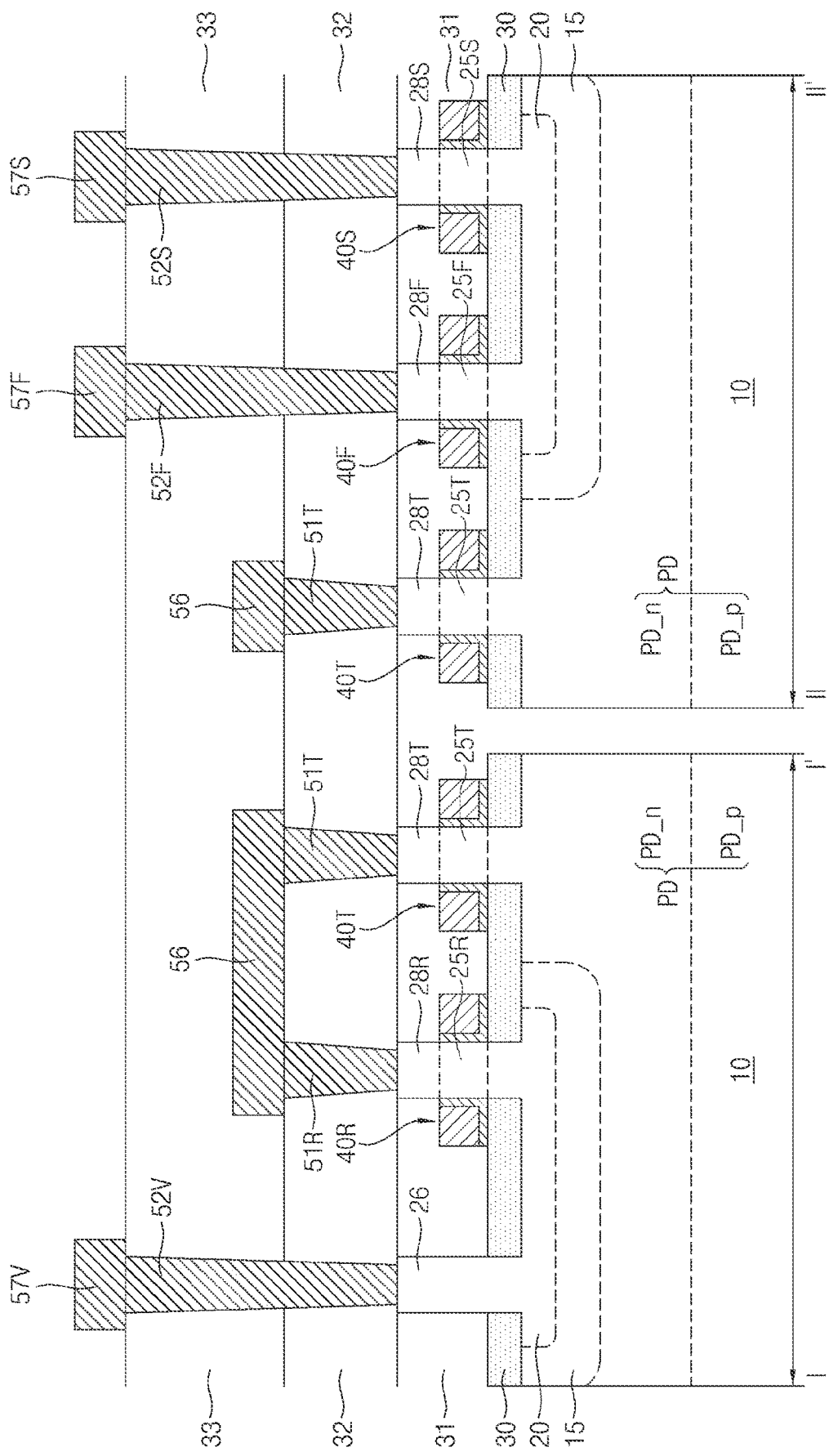

Referring to FIG. 3I, the method may include a process of forming an upper interlayer insulation layer 33, a plurality of upper contact plugs 52V, 52F, and 52S, and a plurality of upper wirings 57V, 57F, and 57S.

The upper interlayer insulation layer 33 may be formed on the middle interlayer insulation layer 32 to cover the lower wirings 56. The upper interlayer insulation layer 33 may include silicon oxide, silicon nitride, or other insulating materials.

The plurality of upper contact plugs 52V, 52F, and 52S may vertically pass through the upper interlayer insulation layer 33 and the middle interlayer insulation layer 32. The upper contact plugs 52V, 52F, and 52S may include a first upper contact plug 52V connected to the electrode area 26, a second upper contact plug 52F connected to the source follower transistor drain area 28F, and a third upper contact plug 52S connected to the selection transistor drain area 28S.

The plurality of upper wirings 57V, 57F, and 57S may be formed on the upper interlayer insulation layer 33. The upper wirings 57V, 57F, and 57S may include a first upper wiring 57V connected to the first upper contact plug 52V, a second upper wiring 57F connected to the second upper contact plug 52F, and a third upper wiring 57S connected to the third upper contact plug 52S. For example, the first upper wiring 57V may be electrically connected to the electrode area 26, the second upper wiring 57F may be electrically connected to the source follower transistor drain area 28F, and the third upper wiring 57S may be electrically connected to the selection transistor drain area 28S. In an example embodiment, the first upper wiring 57V and the second upper wiring 57F may be connected to a source voltage VDD, and the third upper wiring 57S may be connected to an output port Vout.

Figure 4A:
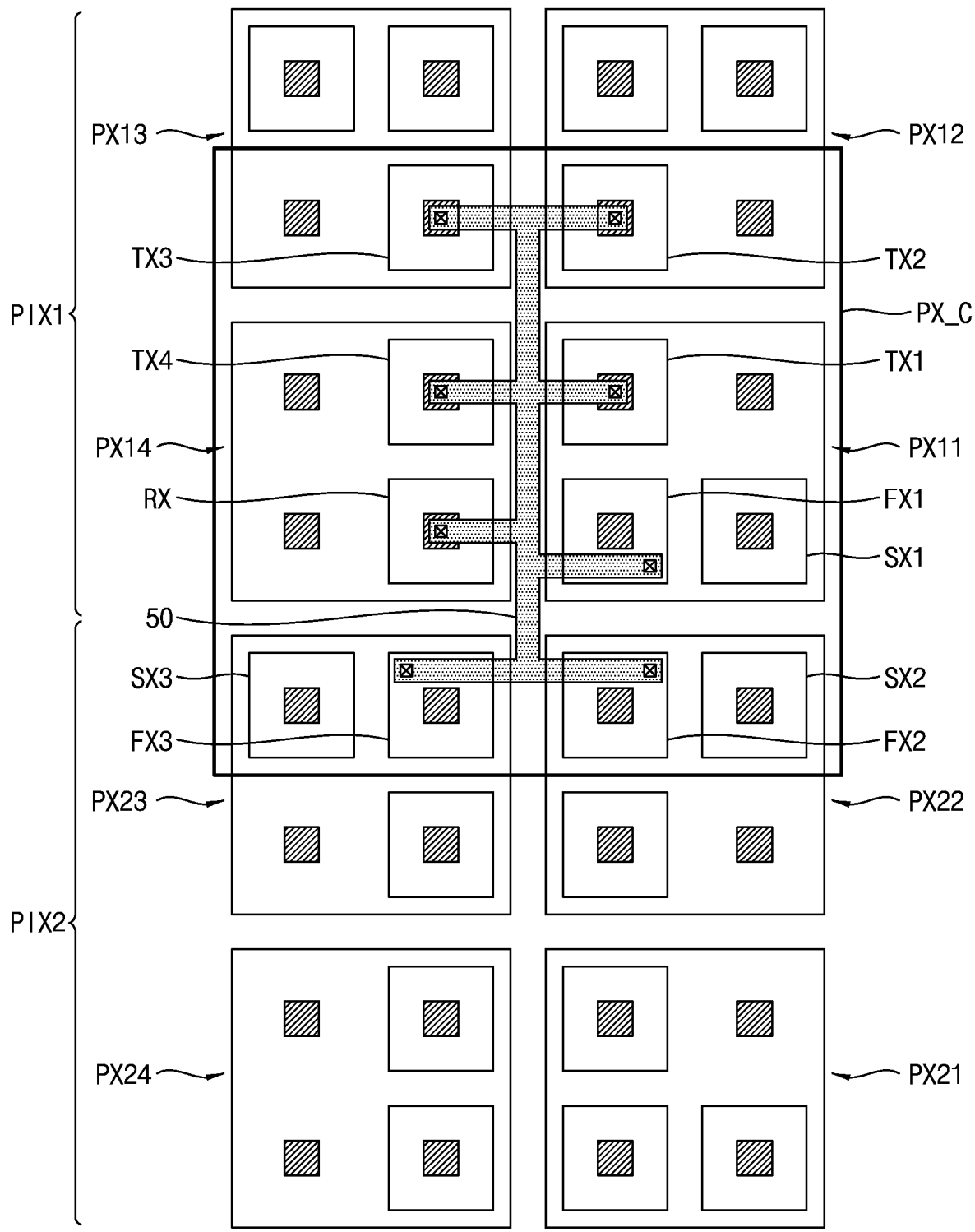
FIG. 4A is a layout illustrating an electrical connection of a pixel block circuit according to example embodiments.

FIG. 4A is a layout illustrating an electrical connection of a pixel block circuit PX_C according to example embodiments. For example, the electric connection of the pixel block circuit PX_C may be implemented in the pixel array illustrated in FIG. 2B.

Referring to FIG. 4A, a first transfer transistor TX1, a second transfer transistor TX2, a third transfer transistor TX3, a fourth transfer transistor TX4, a reset transistor RX, and a first source follower transistor FX1 of a first pixel block PIX1 may be electrically connected to a second source follower transistor FX2 and a third source follower transistor FX3 of a second pixel block PIX2 by a wiring 50. Referring further to FIG. 2B, the first transfer transistor channel region TC1, the second transfer transistor channel region TC2, the third transfer transistor channel region TC3, the fourth transfer transistor channel region TC4, the reset transistor channel region RC, and the first source follower transistor gate electrode FG1 of the first pixel block PIX1 may be electrically connected to the second source follower transistor gate electrode FG2 and the third source follower transistor gate electrode FG3 of the second pixel block PIX2 by the wiring 50. The first pixel block PIX1 may be adjacent to the second pixel block PIX2. That is, one pixel block PIX1 may include four photodiodes PD, four transfer transistors TX1 to TX4, one reset transistor RX, one source follower transistor FX1, and one selection transistor SX1 and may include two source follower transistors FX2 and FX3 and two selection transistors SX2 and SX3 of another pixel block PIX2 adjacent thereto, thereby forming a corresponding pixel circuit.

Referring further to FIGS. 2B to 2D, a plurality of contact plugs connected to the gate electrodes TG1 to TG4, FG1 to FG3. SG1 to SG3, and RG may be disposed at various positions. The contact plugs 51R, 51T, 52V, 52F, and 52S illustrated in FIGS. 3H, 3I, and 4A may be disposed at various positions unlike the illustration.

Figure 4B:
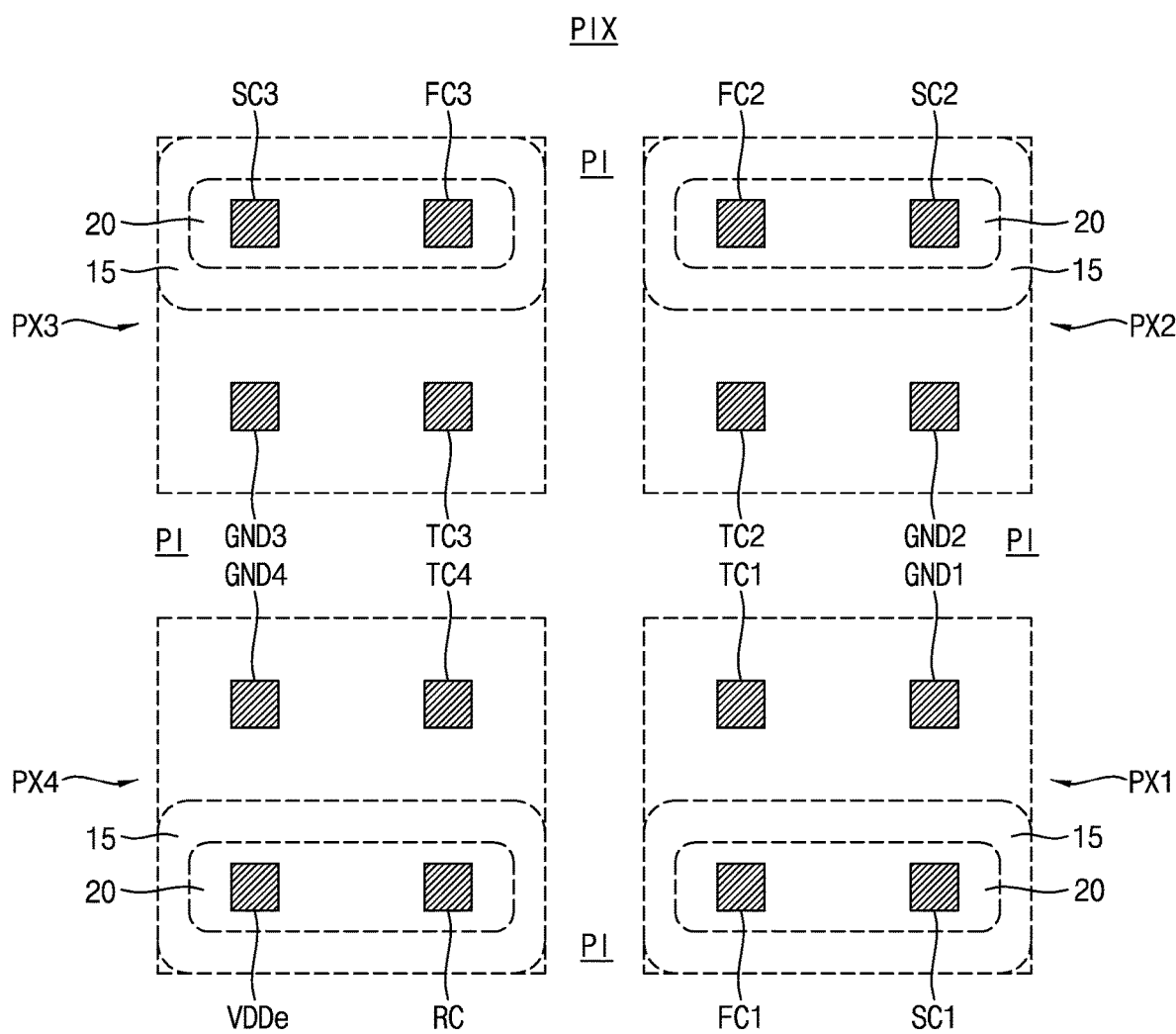
FIG. 4B is a layout showing a plurality of well areas and a plurality of source areas according to an example embodiment.

FIG. 4B is a layout showing a plurality of well areas 15 and a plurality of source areas 20 according to an example embodiment. Referring to FIG. 4B, the plurality of well areas 15 and the plurality of source areas 20 may respectively overlap a first source follower transistor channel region FC1 and a first selection transistor channel region SC1 of a first unit pixel PX1, a second source follower transistor channel region FC2 and a second selection transistor channel region SC2 of a second unit pixel PX2, a third source follower transistor channel region FC3 and a third selection transistor channel region SC3 of a third unit pixel PX3, and a reset transistor channel region RC and a source voltage electrode SVDDe of a fourth pixel PX4.

Figure 5A:
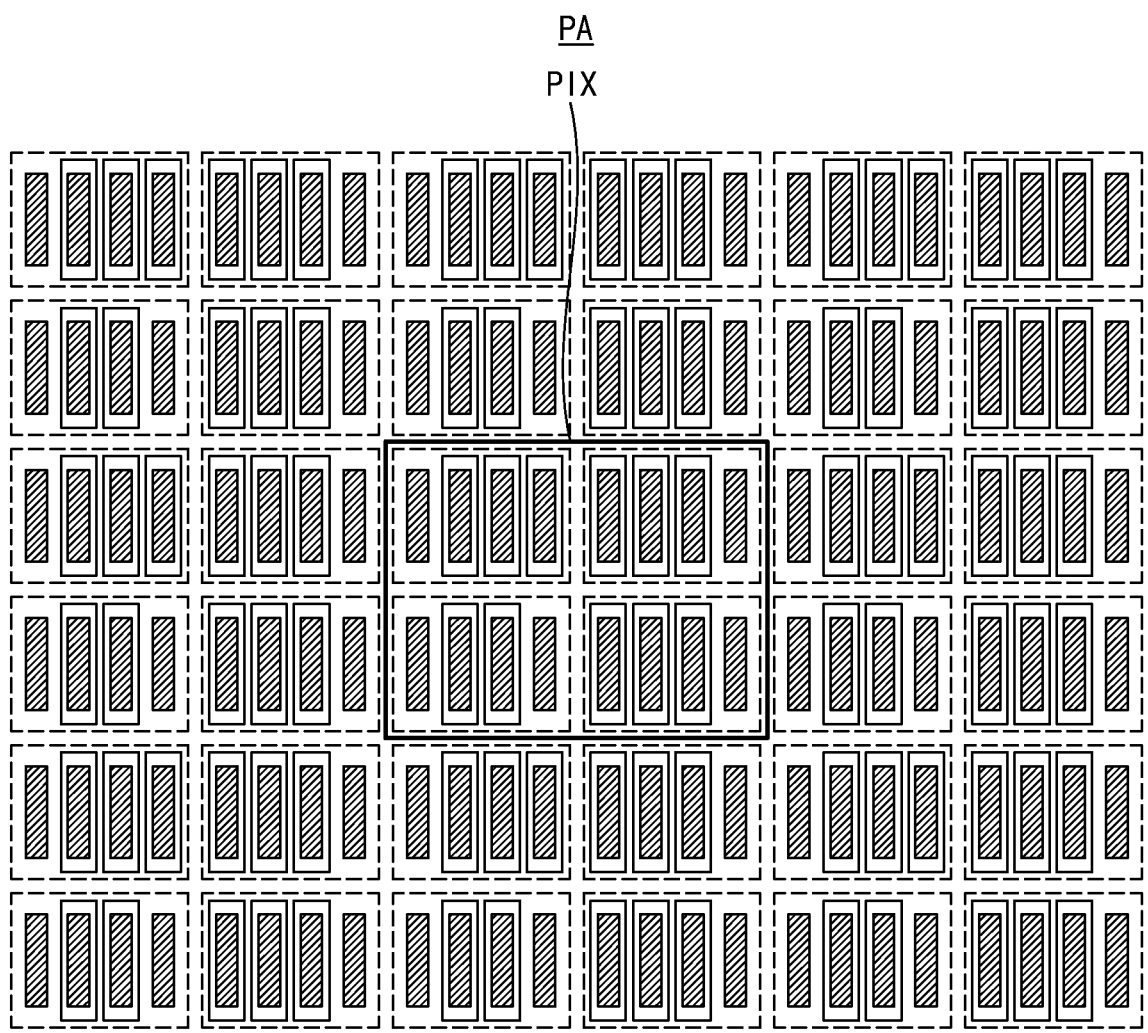
FIG. 5A is a schematic layout of a pixel array of an image sensor according to an example embodiment.
Figure 5B:
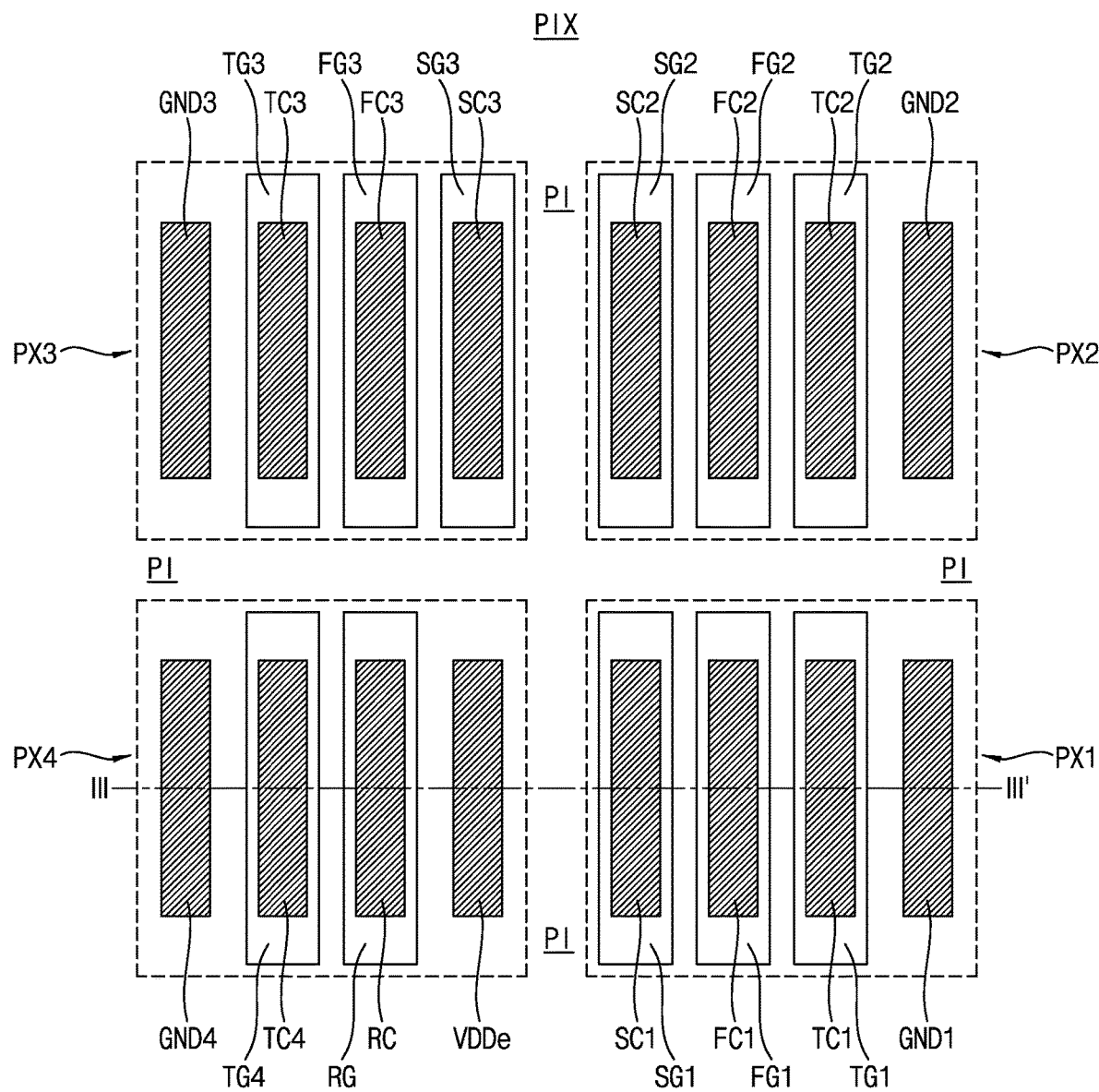
FIGS. 5B, 5C and 5D are layouts conceptually illustrating a pixel block according to various example embodiments.

FIG. 5A is a schematic layout of a pixel array PA of an image sensor according to an example embodiment, and FIG. 5B is an enlarged view of a pixel block PIX.

Referring to FIGS. 5A and 5B, the pixel array PA of the image sensor according to an example embodiment may include a plurality of pixel blocks PIX arranged in a matrix form, and one pixel block PIX may include first to fourth unit pixels PX1 to PX4 arranged in a matrix form. The first to fourth unit pixels PX1 to PX4 may be defined by a plurality of pixel isolation areas PI. The image sensor according to the present example embodiment may be a backside illuminated image sensor, and the first to fourth unit pixels PX1 to PX4 may respectively include first to fourth photodiodes.

The first unit pixel PX1 may include a plurality of first selection transistor structures, a plurality of first source follower transistor structures, a plurality of first transfer transistor structures, and a first ground voltage electrode, which are arranged in parallel. The plurality of first selection transistor structures may include a first selection transistor channel region SC1 and a first selection transistor gate electrode SG1. The first selection transistor gate electrode SG1 may surround the first selection transistor channel region SC1. The plurality of first source follower transistor structures may include a first source follower transistor channel region FC1 and a first source follower transistor gate electrode FG1. The first source follower transistor gate electrode FG1 may surround the first source follower transistor channel region FC1. The plurality of first transfer transistor structures may include a first transfer transistor channel region TC1 and a first transfer transistor gate electrode TG1. The first transfer transistor gate electrode TG1 may surround the first transfer transistor channel region TC1.

The second unit pixel PX2 may include a plurality of second selection transistor structures, a plurality of second source follower transistor structures, a plurality of second transfer transistor structures, and a second ground voltage electrode, which are arranged in parallel. The plurality of second selection transistor structures may include a second selection transistor channel region SC2 and a second selection transistor gate electrode SG2. The second selection transistor gate electrode SG2 may surround the second selection transistor channel region SC2. The plurality of second source follower transistor structures may include a second source follower transistor channel region FC2 and a second source follower transistor gate electrode FG2. The second source follower transistor gate electrode FG2 may surround the second source follower transistor channel region FC2. The plurality of second transfer transistor structures may include a second transfer transistor channel region TC2 and a second transfer transistor gate electrode TG2. The second transfer transistor gate electrode TG2 may surround the second transfer transistor channel region TC2.

The third unit pixel PX3 may include a plurality of third selection transistor structures, a plurality of third source follower transistor structures, a plurality of third transfer transistor structures, and a third ground voltage electrode, which are arranged in parallel. The plurality of third selection transistor structures may include a third selection transistor channel region SC3 and a third selection transistor gate electrode SG3. The third selection transistor gate electrode SG3 may surround the third selection transistor channel region SC3. The plurality of third source follower transistor structures may include a third source follower transistor channel region FC3 and a third source follower transistor gate electrode FG3. The third source follower transistor gate electrode FG3 may surround the third source follower transistor channel region FC3. The plurality of third transfer transistor structures may include a third transfer transistor channel region TC3 and a third transfer transistor gate electrode TG3. The third transfer transistor gate electrode TG3 may surround the third transfer transistor channel region TC3.

The fourth unit pixel PX4 may include a source voltage electrode VDDe, a plurality of reset transistor structures, a plurality of fourth transfer transistor structures, and a fourth ground voltage electrode GND4, which are arranged in parallel. The plurality of reset transistor structures may include a reset transistor channel region RC and a reset transistor gate electrode RG. The reset transistor gate electrode RG may surround the reset transistor channel region RC. The plurality of fourth transfer transistor structures may include a fourth transfer transistor channel region TC4 and a fourth transfer transistor gate electrode TG4. The fourth transfer transistor gate electrode TG4 may surround the fourth transfer transistor channel region TC4.

For example, three unit pixels PX1 to PX3, from among four unit pixels PX1 to PX4, may respectively include a plurality of selection transistor structures SC1 to SC3 and SG1 to SG3, a plurality of source follower transistor structures FC1 to FC3 and FG1 to FG3, a plurality of transfer transistor structures TC1 to TC3 and TG1 to TG3, and a plurality of ground voltage electrodes GND1 to GND3, and one unit pixel PX4 may include a source voltage electrode VDDe, a plurality of reset transistor structures RC and RG, a plurality of transfer transistor structures TC4 and TG4, and a ground voltage electrode GND4.

The first to fourth transfer transistor structures TC1 to TC4 and TG1 to TG4, the first to third source follower transistor structures FC1 to FC3 and FG1 to FG3, the first to third selection transistor structures SC1 to SC3 and SG1 to SG3, and the reset transistor structures RC and RG may each have an elongated bar shape. For example, the first to fourth transfer transistor channel regions TC1 to TC4, the first to third source follower transistor channel regions FC1 to FC3, the first to third selection transistor channel regions SC1 to SC3, and the reset transistor channel region RC may each have an elongated bar shape. The first to fourth transfer transistor gate electrodes TG1 to TG4, the first to third source follower transistor gate electrodes FG1 to FG3, the first to third selection transistor gate electrodes SG1 to SG3, and the reset transistor gate electrode RG may each have a tetragonal rim shape or a frame shape. In addition, the first to fourth ground voltage electrodes GND1 to GND4 and the source voltage electrode VDDe may each have an elongated bar shape.

In the present example embodiment, positions of the first to fourth unit pixels PX1 to PX4 may be variously changed. Also, in one of the first to fourth unit pixels PX1 to PX4, positions of the transfer transistor structures TG1 to TG4, the source follower transistor structures FG1 to FG3, the selection transistor structures SG1 to SG3, the ground voltage electrodes GND1 to GND4 and the source voltage electrode VDDe may be variously changed.

Referring further to FIG. 2C, the channel regions TC1 to TC4, FC1 to FC3, SC1 to SC3, and RC, the ground voltage electrodes GND1 to GND4, and the source voltage electrode VDDe may each include a plurality of round corner portions. Also, the gate electrodes TG1 to TG4, FG1 to FG3, SG1 to SG3, and RG may each include a plurality of round corner portions.

Figure 5C:
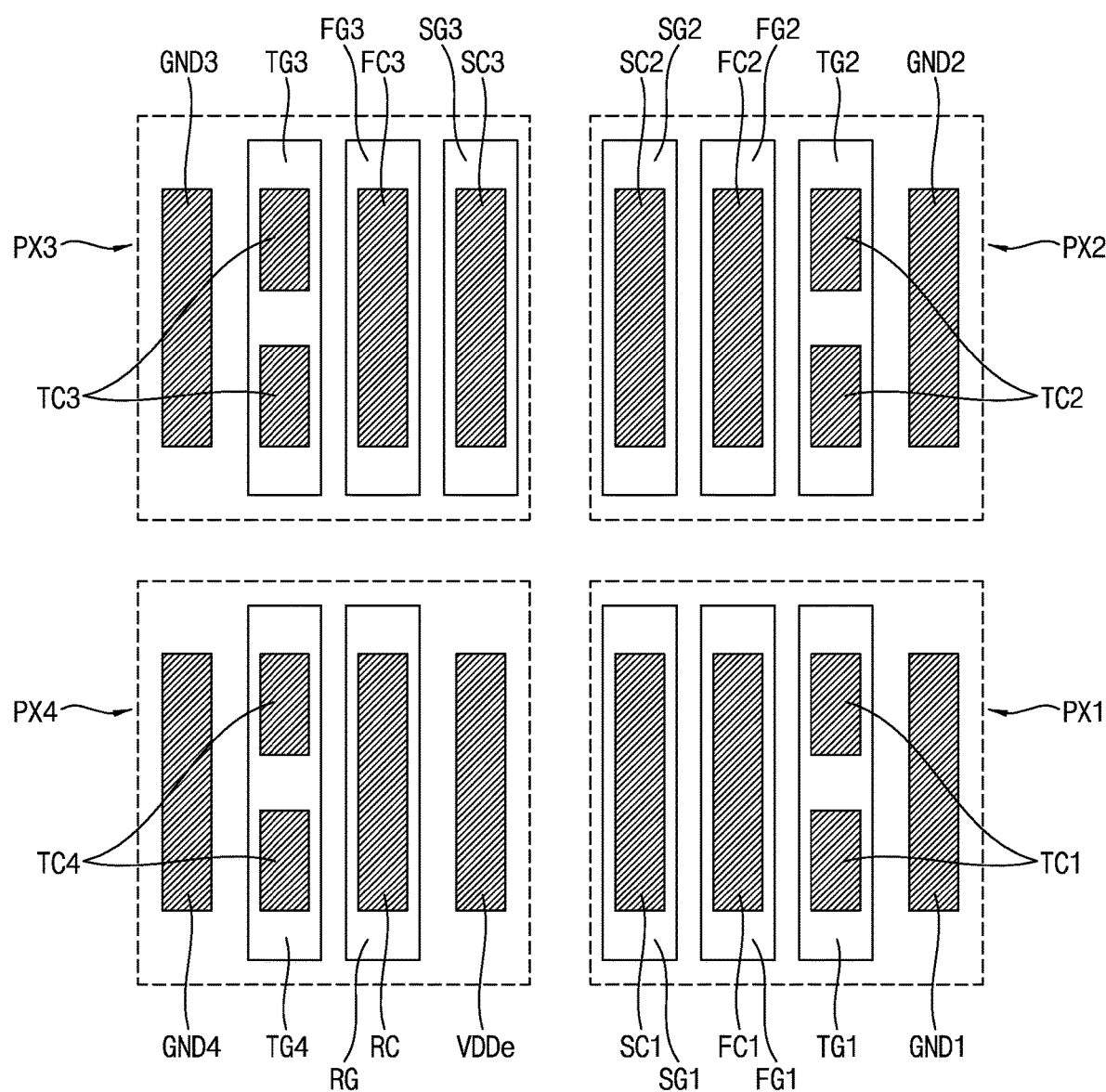
Figure 5D:
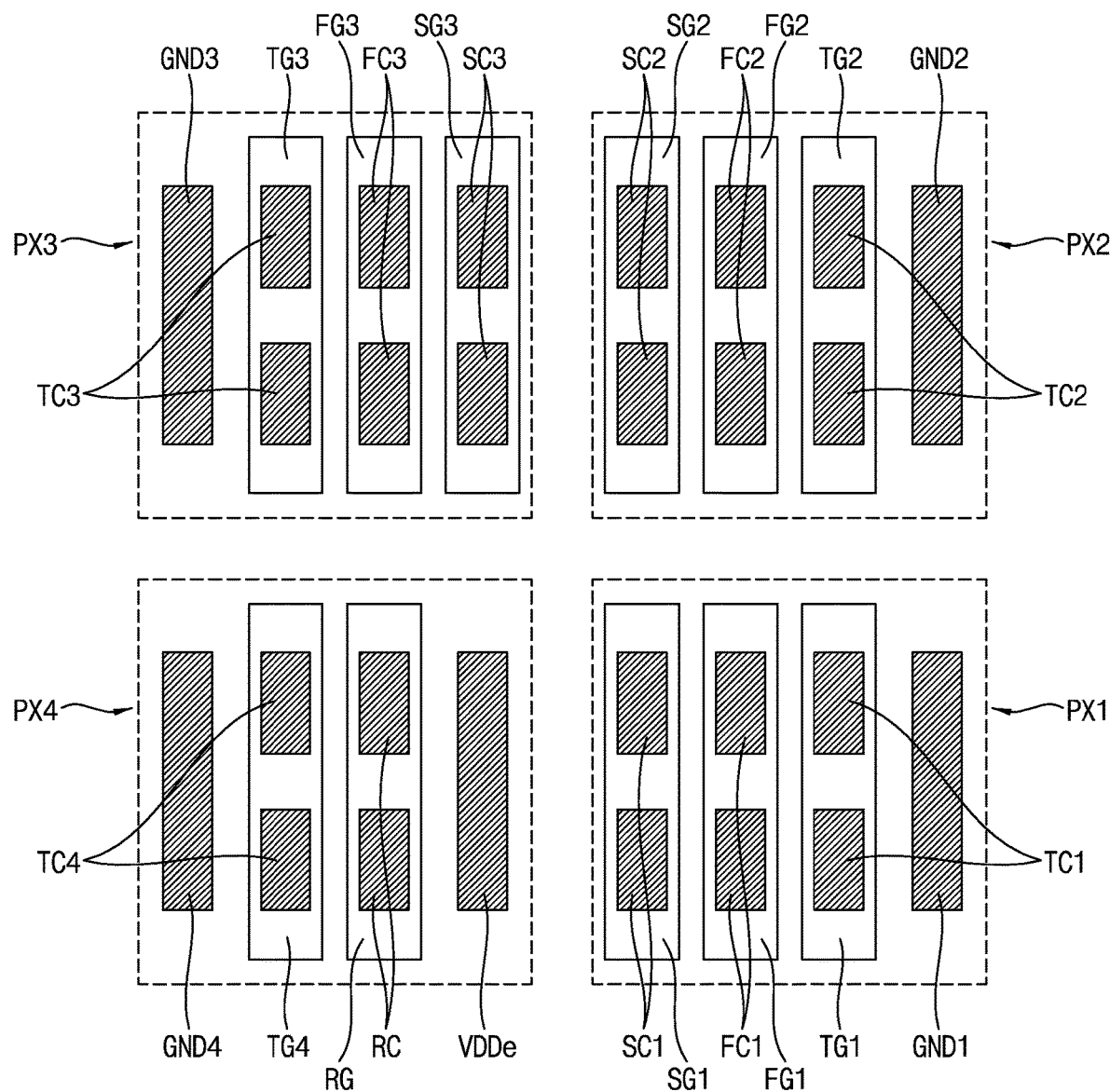

FIGS. 5C and 5D are layouts conceptually illustrating a pixel block PIX according to various example embodiments.

Referring to FIG. 5C, each of a plurality of transfer transistor channel regions TC1 to TC4 may be provided in plurality. For example, the transfer transistor channel regions TC1 to TC4 may have a square shape or a shortly elongated bar shape. Each of the plurality of transfer transistor channel regions TC1 to TC4 may be driven by a corresponding transfer transistor gate electrode of a plurality of transfer transistor gate electrodes TG1 to TG4. By using the plurality of transfer transistor channel regions TC1 to TC4, a channel width may be enlarged and transfer efficiency may increase.

Referring to FIG. 5D, each of a plurality of channel regions TC1 to TC4, FC1 to FC3, SC1 to SC3, and RC may be provided in plurality. As described above, each of the plurality of channel regions TC1 to TC4, FC1 to FC3, SC1 to SC3, and RC may be driven by a corresponding gate electrode of a plurality of gate electrodes TG1 to TG4, FG1 to FG3, SG1 to SG3, and RG. By using the plurality of channel regions TC1 to TC4, FC1 to FC3, SC1 to SC3, and RC, a channel width may be enlarged and transfer efficiency may increase.

Referring further to FIG. 2D, the channel regions TC1 to TC4, FC1 to FC3, SC1 to SC3, and RC, the ground voltage electrodes GND1 to GND4, and the source voltage electrode VDDe may have a circular shape, and the gate electrodes TG1 to TG4, FG1 to FG3, SG1 to SG3, and RG may have a circular disk shape. The elements may not include a plurality of sharp portions and may each include a plurality of circular outer surfaces or round corner portions, and thus, an electric field may be prevented from concentrating on the sharp portions.

Vertical cross-sectional surfaces of the pixel block PIX of the image sensor according to various example embodiments illustrated in FIGS. 5A to 5D will be described below with reference to FIG. 6A to 6E or 8A to 8E.

FIGS. 6A to 6E are vertical cross-sectional views taken along line III-III' of FIG. 5B, for describing a method of manufacturing an image sensor according to an example embodiment.

Figure 6A:
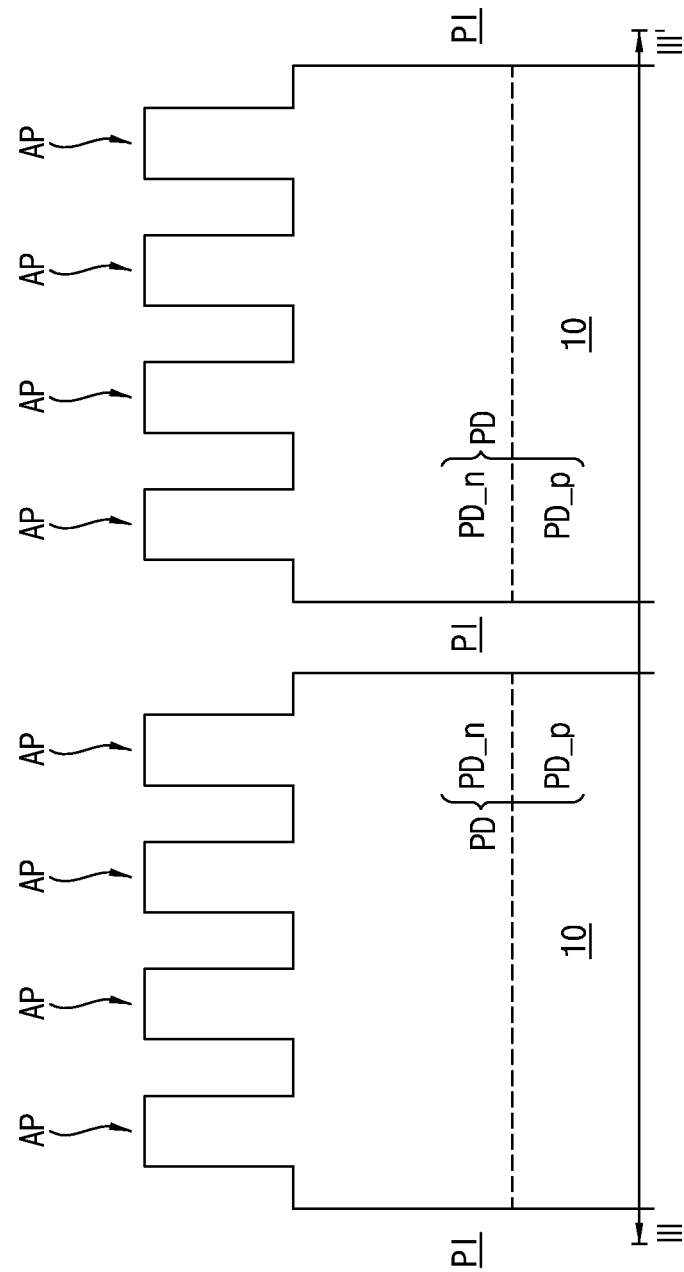

Referring to FIG. 6A, the method of manufacturing an image sensor according to an example embodiment may include a process of forming a plurality of photodiodes PD in a substrate 10 and selectively recessing an upper portion of the substrate 10 to form a plurality of active areas AP. Each of the plurality of photodiodes PD may include a P-type area PD_p and an N-type area PD_n. For example, a left photodiode PD may be the fourth photodiode PD of the fourth unit pixel PX4, and a right photodiode PD may be the first photodiode PD of the first unit pixel PX1. Each of the plurality of photodiodes PD may be included in one of the first to fourth unit pixels PX1 to PX4.

By performing a recess process, the active areas AP may be formed in a plurality of dam shapes on the N-type area PD_n of the photodiode PD of each of the first to fourth unit pixels PX1 to PX4.

Figure 6B:
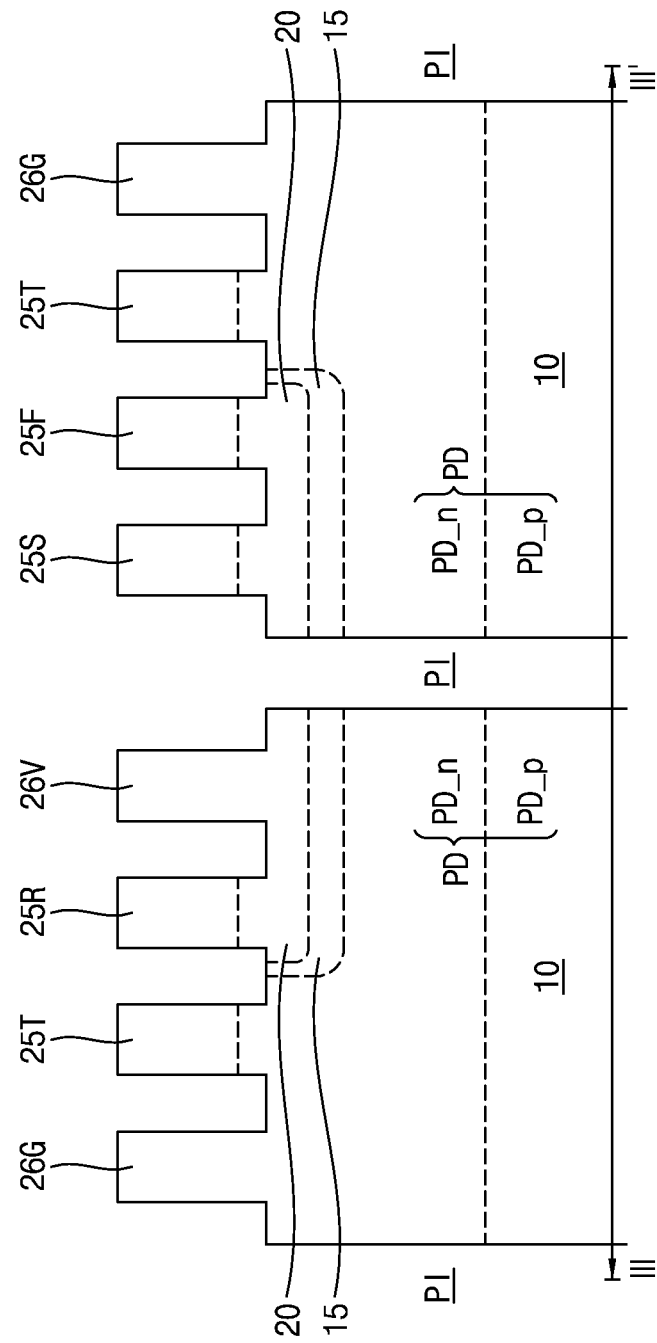

Referring to FIG. 6B, the method may include a process of forming a plurality of well areas 15, a plurality of source areas 20, a plurality of channel areas 25T, 25R, 25S, and 25F, and a plurality of electrode areas 26G and 26V by performing ion injection processes. For example, the ion injection processes may include a first ion injection process of forming the plurality of well areas 15, a second ion injection process of forming the plurality of source areas 20, and a third ion injection process of forming the plurality of channel areas 25T, 25R, 25S, and 25F. The plurality of well areas 15 may be formed by the first ion injection process, the plurality of source areas 20 may be formed by the second ion injection process, and the plurality of channel areas 25T, 25R, 25S, and 25F may be formed by the third ion injection process. The first ion injection process may include a process of injecting a P-type ion such as boron (B), the second ion injection process may include a process of injecting an N-type ion such as phosphorous (P) and/or arsenic (As), and the third ion injection process may include a process of injecting a P-type ion such as boron (B). The first ion injection process and the second ion injection process may include an inclined ion injection process.

Figure 6C:
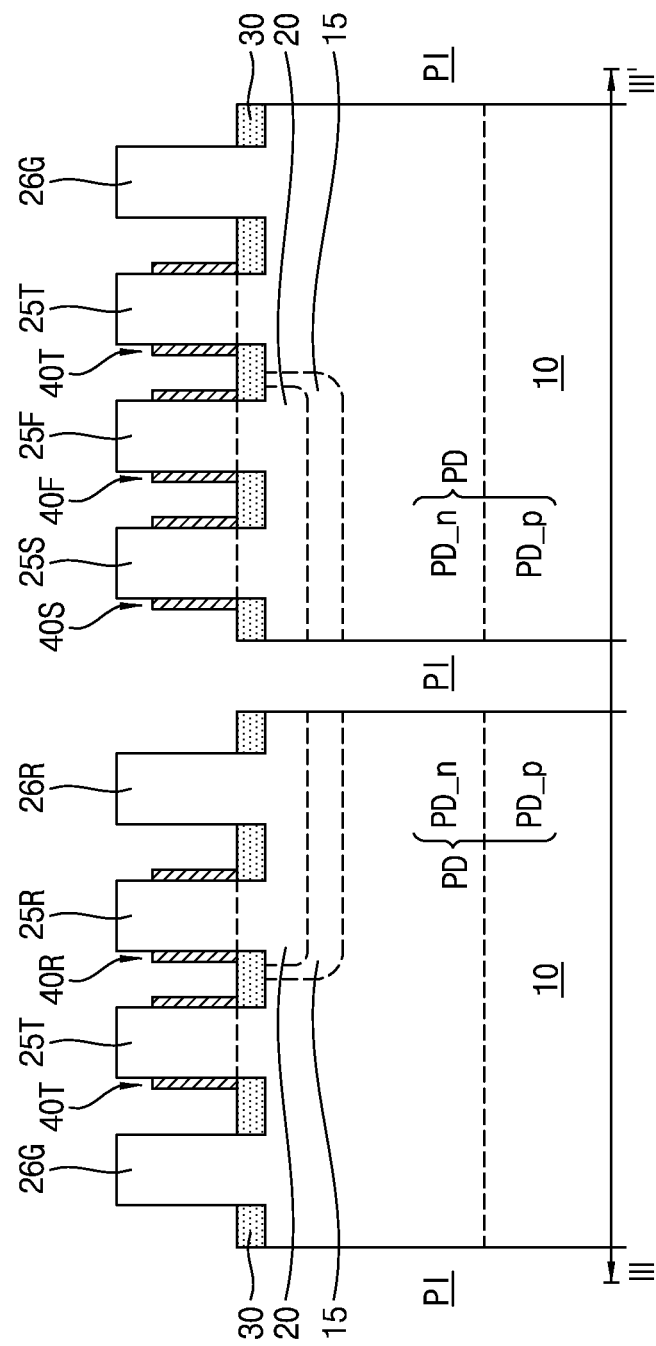

Referring to FIG. 6C, the method may include a process of forming a spacer layer 30 and forming a plurality of gate structures 40T, 40R, 40S, and 40F.

The spacer layer 30 may cover a surface of the substrate 10 exposed between an electrode area 26 and the channel areas 25R, 25T, 25F, and 25S and lower side surfaces of the electrode area 26 and the channel areas 25R, 25T, 25F, and 25S. The spacer layer 30 may include silicon oxide, silicon nitride, or other insulating materials. The process of forming the spacer layer 30 may include a process of wholly forming a spacer material layer through a deposition process or a coating process, and then, partially removing an upper portion of the spacer material layer through a recess process such as an etch-back process.

The process of forming the plurality of gate structures 40T, 40R, 40S, and 40F may include a process of performing the processes described above with reference to FIGS. 3D to 3F. For example, referring to FIG. 3F or 3G, the gate structures 40T, 40R, 40S, and 40F may respectively include a plurality of gate insulation layers 41T, 41R, 41S, and 41F and a plurality of gate electrodes 42T, 42R, 42S, and 42F.

The gate structures 40T, 40R, 40S, and 40F may surround lower portions of the channel areas 25T, 25R, 25S, and 25F. For example, upper portions of the channel areas 25T, 25R, 25S, and 25F may not be surrounded by the gate structures 40T, 40R, 40S, and 40F. The gate insulation layers 41T, 41R, 41S, and 41F may have an elbow shape (for example, an L-shape) which surrounds one side surfaces and bottom surfaces of the gate electrodes 42T, 42R, 42S, and 42F.

Figure 6D:
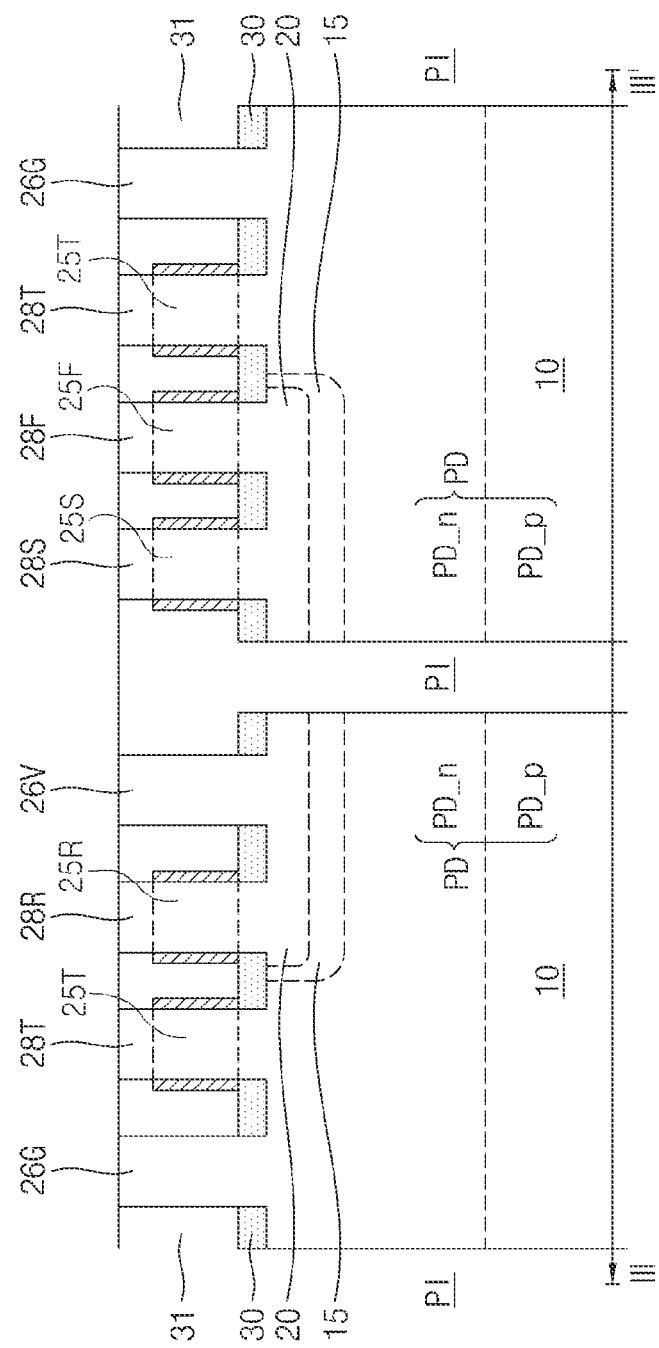

Referring to FIG. 6D, the method may include a process of forming a plurality of drain areas 28T, 28R, 28S, and 28F and forming a lower interlayer insulation layer 31. For example, drain areas 28T, 28R, 28S, and 28F may be formed on the each of the upper portions of the channel areas 25T, 25R, 25S, and 25F. The drain areas 28T, 28R, 28S, and 28F may include a transfer transistor drain area 28T, a reset transistor drain area 28R, a selection transistor drain area 28S, and a source follower transistor drain area 28F. In an example embodiment, the process of forming the plurality of drain areas 28T, 28R. 28S, and 28F may include a process of performing an ion injection process. In an example embodiment, the process of forming the plurality of drain areas 28T, 28R, 28S, and 28F may include a process of forming a silicide area. Also, the electrode areas 26G and 26V may include metal silicide. The process of forming the lower interlayer insulation layer 31 may include a process of depositing or coating an insulating material and performing a CMP process or an etch-back process.

Referring to FIG. 6E, the method may include a process of forming a middle interlayer insulation layer 32, an upper interlayer insulation layer 33, a plurality of contact plugs 51 and 52, and a plurality of wirings 56 and 57.

The middle interlayer insulation layer 32 may be formed on the lower interlayer insulation layer 31 and the drain areas 28T, 28R. 28S, and 28F. The middle interlayer insulation layer 32 may include silicon oxide, silicon nitride, or other insulating materials.

A plurality of lower contact plugs 51 may vertically pass through the middle interlayer insulation layer 32 and may be connected to the drain areas 28T and 28R corresponding thereto.

A plurality of lower wirings 56 may be formed on the middle interlayer insulation layer 32 so as to be connected to the lower contact plugs 51. The upper interlayer insulation layer 33 may be formed on the middle interlayer insulation layer 32 to cover the lower wirings 56. The upper interlayer insulation layer 33 may include silicon oxide, silicon nitride, or other insulating materials.

A plurality of upper contact plugs 52 may vertically pass through the upper interlayer insulation layer 33 and the middle interlayer insulation layer 32. The upper contact plugs 52 may be electrically connected to the electrode areas 26G and 26V, the source follower transistor drain area 28F, and the selection transistor drain area 28S.

The upper wirings 57 may be formed on the upper interlayer insulation layer 33. The upper wirings 33 may be electrically connected to the upper contact plugs 52. The upper wirings 57 may be connected to a source voltage VDD, a ground voltage GNG, and an output port Vout.

A connection shape of the lower contact plugs 51, the upper contact plugs 52, the lower wirings 56, and the upper wirings 57 may be conceptual. For example, the lower contact plugs 51 and the lower wiring 56 show that the reset transistor drain area 28R may be electrically connected to the transfer transistor drain area 28T.

Figure 7:
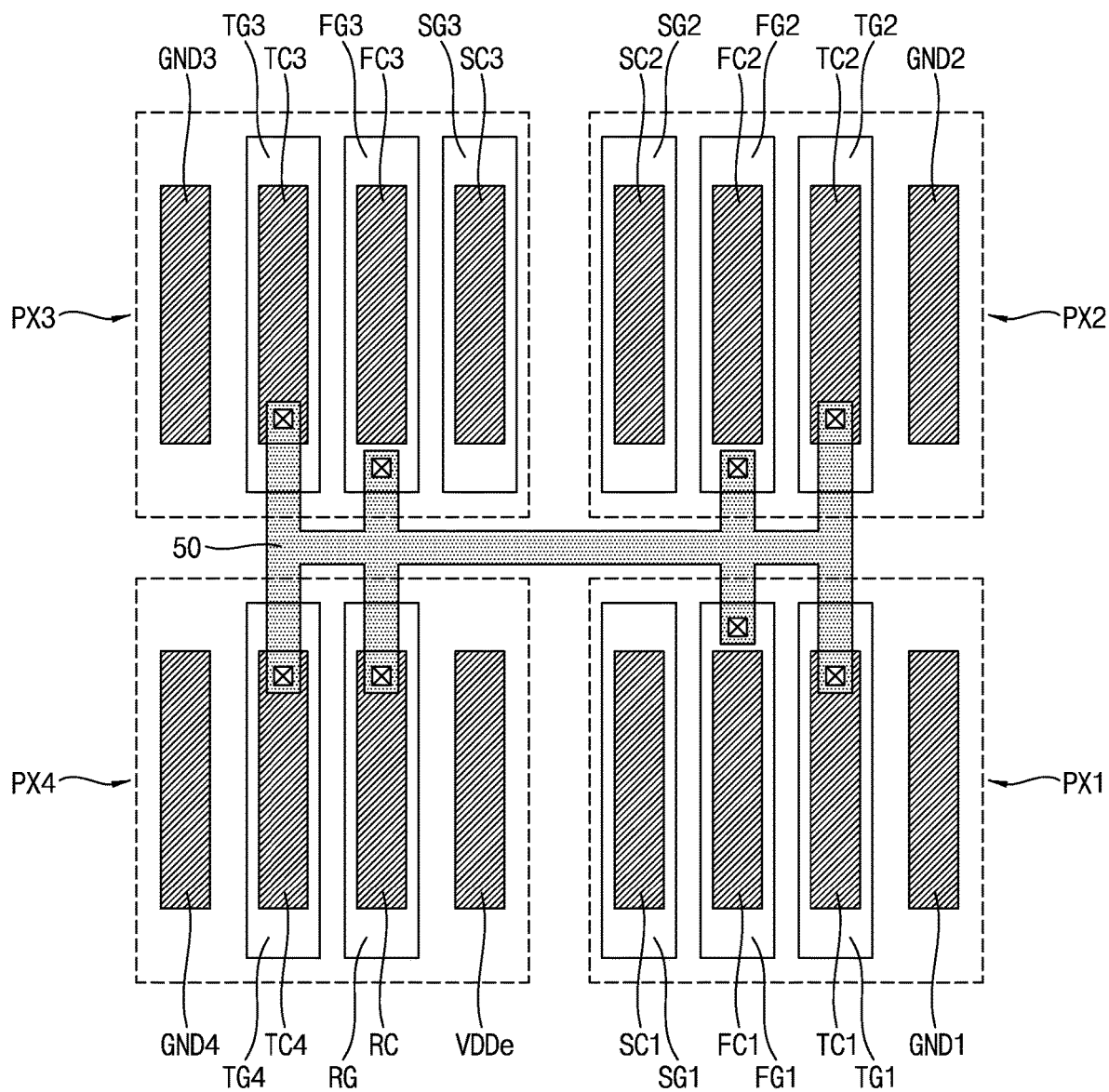
FIG. 7 is a layout illustrating an electrical connection of a pixel block according to an example embodiment.

FIG. 7 is a layout illustrating an electrical connection of a pixel block PIX according to an example embodiment. For example, the electric connection may be implemented in the pixel block illustrated in FIG. 5B. Referring to FIG. 7, a first transfer transistor channel region TC1, a second transfer transistor channel region TC2, a third transfer transistor channel region TC3, a fourth transfer transistor channel region TC4, a reset transistor channel region RC, a first source follower transistor gate electrode FG1, a second source follower transistor gate electrode FG2, and a third source follower transistor gate electrode FG3 may be electrically connected to one another by a wiring 50.

FIGS. 8A to 8E are vertical cross-sectional views taken along line III-III' of FIG. 5B, for describing a method of manufacturing an image sensor according to an example embodiment.

Figure 8A:
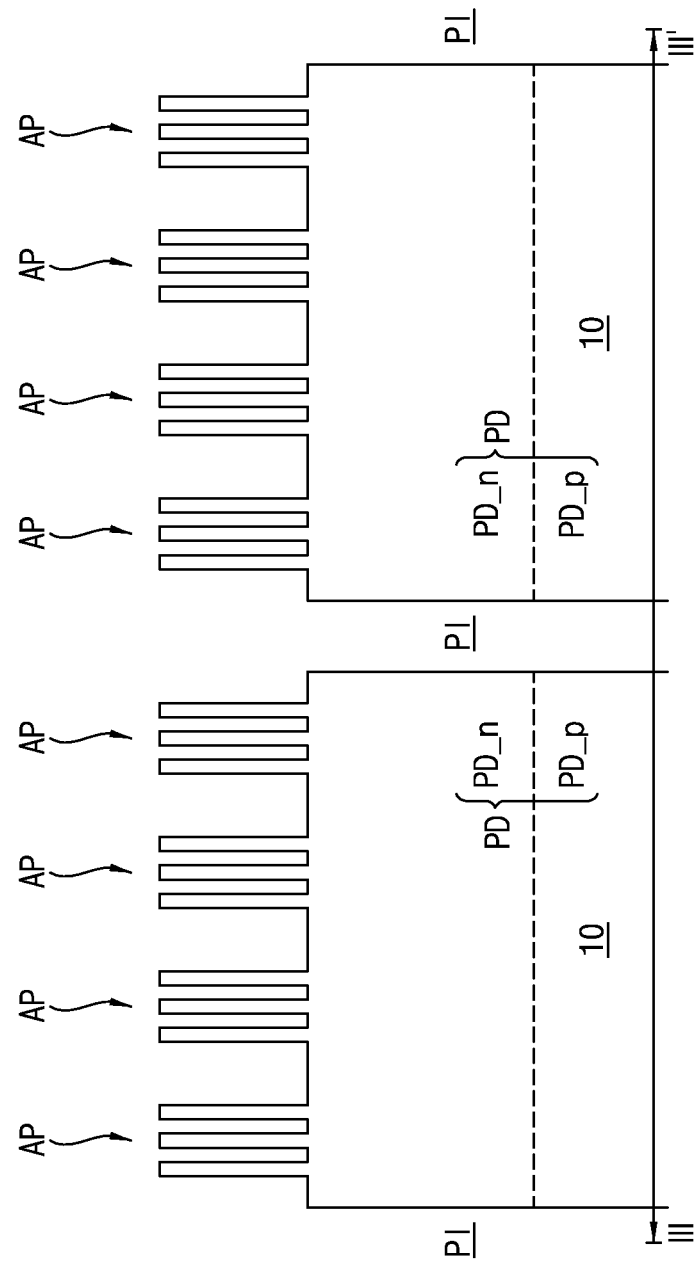

Referring to FIG. 8A, the method of manufacturing an image sensor according to an example embodiment may include a process of forming a plurality of photodiodes PD in a substrate 10 and selectively recessing an upper portion of the substrate 10 to form a plurality of active areas AP. The active areas AP may be respectively formed in a plurality of dam shapes.

Referring to FIG. 8B, the method may include a process of forming a plurality of well areas 15, a plurality of source areas 20, a plurality of channel regions 25T, 25R, 25S, and 25F, and a plurality of voltage electrodes 26G and 26V.

Figure 8C:
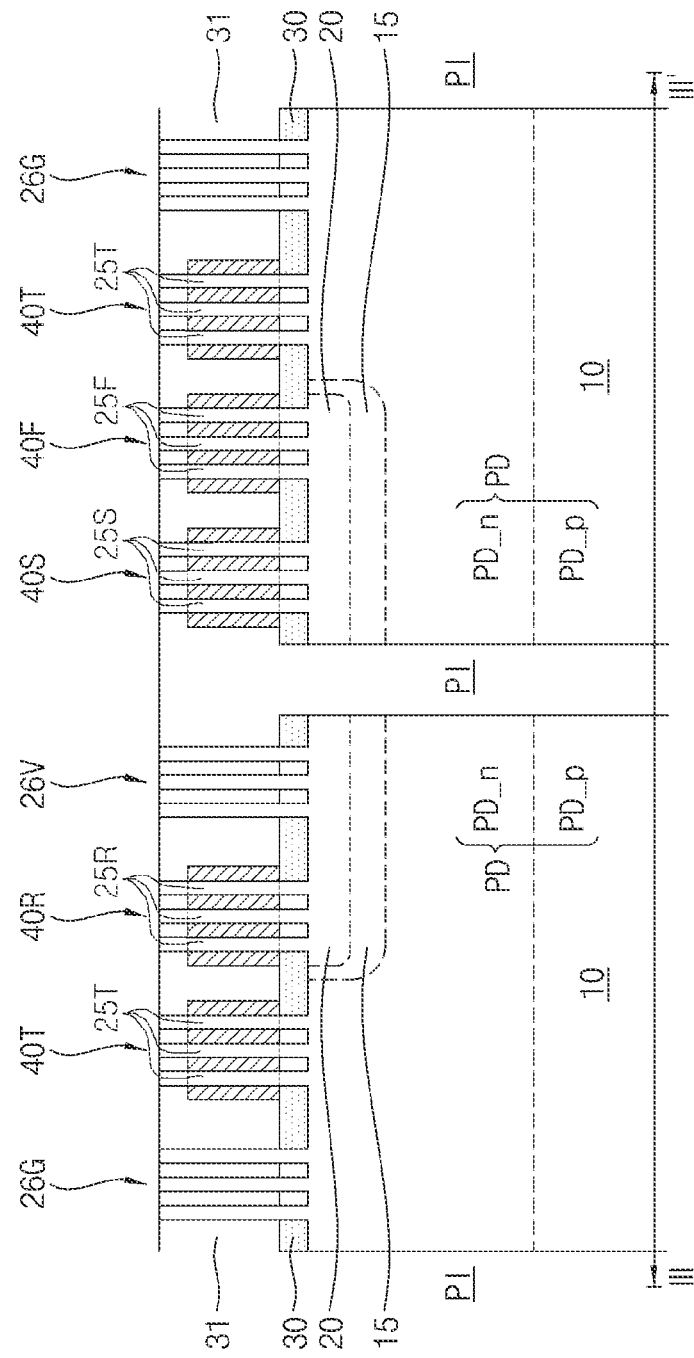

Referring to FIG. 8C, the method may include a process of forming a spacer layer 30, forming a plurality of gate structures 40T, 40R, 40S, and 40F, and forming a lower interlayer insulation layer 31. The lower interlayer insulation layer 31 may surround side surfaces of the channel regions 25T, 25R, 25S, and 25F and may expose top surfaces of the channel regions 25T, 25R, 25S, and 25F.

Figure 8D:
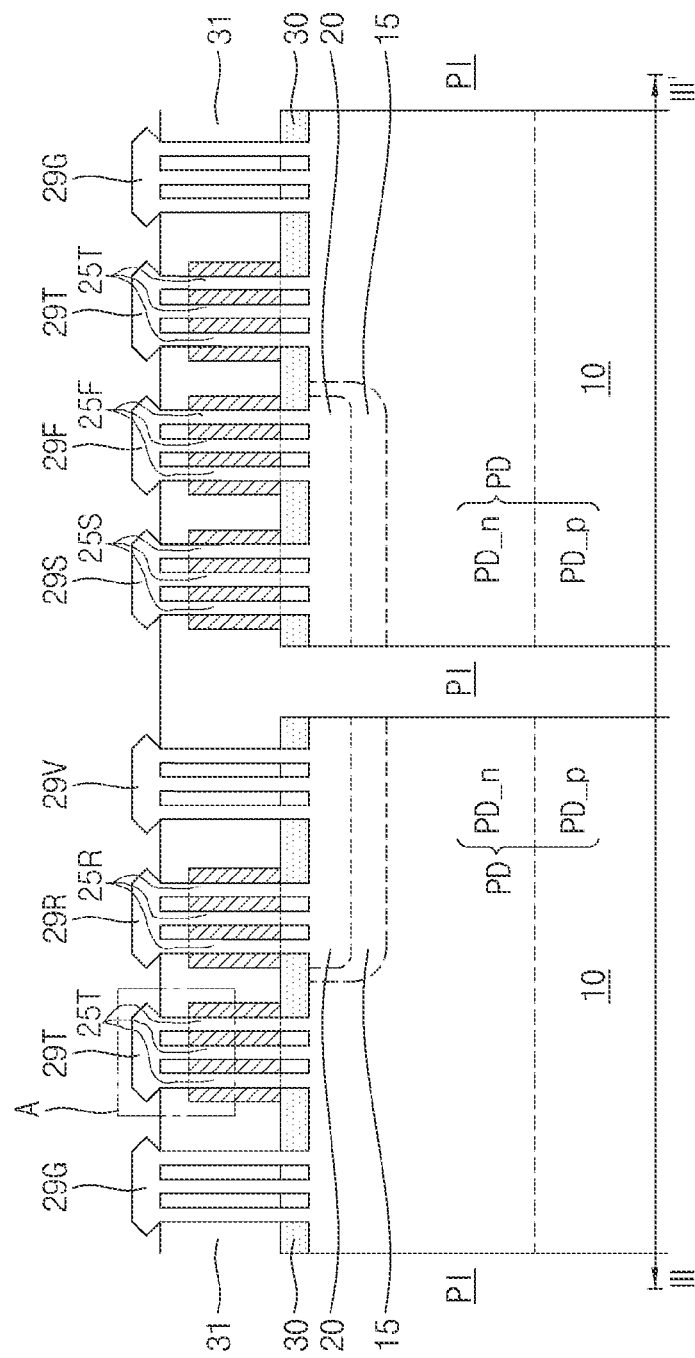

Referring to FIG. 8D, the method may include a process of forming integrated electrode areas 29G and 29V and integrated drain areas 29T, 29R, 29S, and 29F.

The method may further include a process of injecting ions into the integrated drain areas 29T, 29R, 29S, and 29F. Therefore, the integrated drain areas 29T, 29R, 29S, and 29F may include an N-type ion. In an example embodiment, the ion injection process may be performed simultaneously with an epitaxial growth process. Accordingly, the integrated electrode areas 29G and 29V may also include an N-type ion.

In an example embodiment, the method may further include a process of silicifying the integrated drain areas 29T, 29R, 29S, and 29F. For example, the integrated drain areas 29T, 29R, 29S, and 29F may include metal silicide. The integrated electrode areas 29G and 29V may also include metal silicide.

Figure 8E:
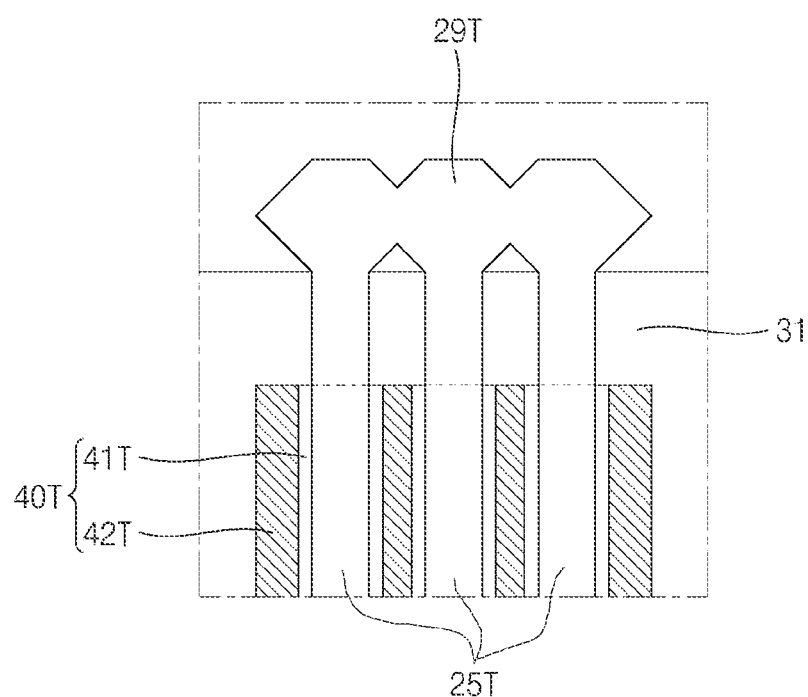

FIG. 8E is an enlarged view of a region A of FIG. 8D. Referring to FIG. 8E, by performing an epitaxial growth process, the integrated drain areas 29T, 29R, 29S, and 29F may be formed by integrating a silicon layer grown from the plurality of channel regions 25T, 25R, 25S, and 25F. Referring further to FIG. 8C, in the gate structures 40T, 40R, 40S, and 40F between a plurality of dam type channel regions 25T, 25R. 25S, and 25F, a plurality of gate insulation layers 41T, 41R, 41S, and 41F may surround, in a U-shape, both sidewalls and bottom surfaces of a plurality of gate electrodes 42T, 42R, 42S, and 42F. In the gate structures 40T, 40R, 40S, and 40F outside the plurality of dam type channel regions 25T, 25R, 25S, and 25F, the plurality of gate insulation layers 41T. 41R, 41S, and 41F may surround, in an L-shape, one sidewalls and bottom surfaces of the plurality of gate electrodes 42T, 42R, 42S, and 42F.

Figure 9A:
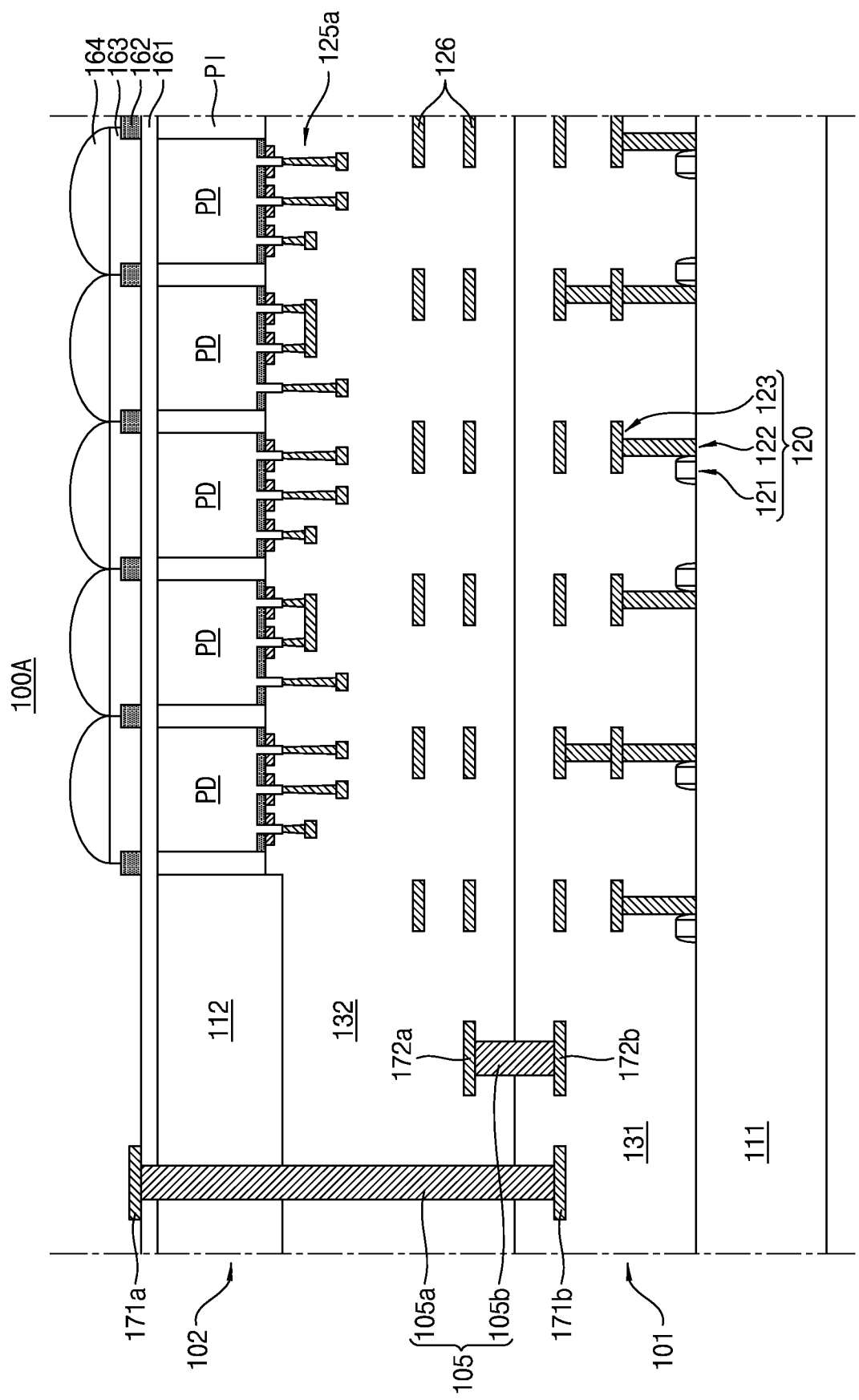

FIGS. 9A and 9B are vertical cross-sectional views illustrating a plurality of image sensors 100A and 100B according to example embodiments.

Referring to FIGS. 9A and 9B, the image sensors 100A and 100B according to example embodiments may include a lower device 101, an upper device 102, and a plurality of through-silicon vias (TSVs) 105.

The lower device 101 may include a plurality of logic circuits 120 disposed on a lower substrate 111. The lower substrate 111 may include a silicon substrate.

The plurality of logic circuits 120 may include a plurality of logic transistors 121, a plurality of logic vias 122, and a plurality of logic wirings 123. The logic vias 122 and the logic wirings 123 may include a conductor such as metal or metal silicide. The logic circuits 120 may be covered by a lower interlayer insulation layer 131. The lower interlayer insulation layer 131 may include silicon oxide.

The upper device 102 may include a plurality of photodiodes PD and a plurality of isolation areas PI formed in an upper substrate 112, a plurality of cell circuits 125a and 125b and a plurality of cell wirings 126 disposed on a bottom surface of the upper substrate 112, and a buffer layer 161, a plurality of grid patterns 162, a plurality of color filters 163, and a plurality of lenses 164 disposed on a top surface of the upper substrate 112. The upper substrate 112 may include a silicon substrate 112.

Each of the plurality of photodiodes PD may include an N-type doping area and a P-type doping area. The photodiodes PD may be defined by the isolation areas PI. The isolation areas PI may include a deep trench isolation DTI or a P-type doping area. In an example embodiment, the isolation areas PI may be formed by forming a deep trench in the upper substrate 112 and filling an insulating material, such as silicon oxide, in the deep trench. In an example embodiment, the isolation areas PI may include P-type ions injected into the upper substrate 112.

The cell circuits 125a and 125b may include a plurality of transistors TX1 to TX4, SF1 to SF3, SX1 to SX3, and RX or a plurality of transistor structures TG1 to TG4, TC1 to TC4, FG1 to FG3, FC1 to FC3, SG1 to SG3, SC1 to SC3, RG, and RC, first to third ground voltage electrodes GND1 to GND3, a source voltage electrode VDDe, a plurality of contact plugs 51R, 51T, 52V, 52F, and 52S, and a plurality of wirings 56, 57V, 57F, and 57S each described above with reference to FIGS. 1 to 8E. Surfaces of channel regions and voltage electrodes of the cell circuits 125a and 125b and a bottom surface of the upper substrate 112 may be coplanar.

The plurality of cell wirings 126 may transfer electrical signals from the cell circuits 125a and 125b to the logic circuits 120, or may transfer the electrical signals from the outside to the cell circuits 125a and 125b. The cell wirings 126 may include a conductor such as metal.

The plurality of cell circuits 125a and 125b and the plurality of cell wirings 126 may be covered by the upper interlayer insulation layer 132. The upper interlayer insulation layer 132 may include silicon oxide.

The buffer layer 161 may be formed on surfaces of the upper substrate 112, surfaces of the isolation areas PI, and surfaces of the photodiodes PD. A top surface of the buffer layer 161 may be flat. The buffer layer 161 may include silicon oxide, silicon nitride, silicon oxynitride, or other insulating materials.

The plurality of grid patterns 162 may be vertically aligned with and overlap the isolation areas PI to respectively define surface areas of the plurality of photodiodes PD. In a top view, the grid patterns 162 may have a grid or mesh shape. The grid patterns 162 may include metal such as tungsten.

The plurality of color filters 163 may include a polymer organic material having one color among red (R), green (G), and blue (B). The color filters may transmit only light having a wavelength corresponding to an allocated color.

The plurality of lenses 164 may include a semispherical shape so that light concentrates on a corresponding photodiode 164. The lenses 164 may include a polymer organic material.

The plurality of TSVs 105 may include a first TSV 105a and a second TSV 105b. The first TSV 105a may pass through the upper device 102. In an example embodiment, the first TSV 105a may electrically connect a first upper pad 171a, disposed on a surface of the upper device 102, to a first lower pad 171b disposed in the lower device 101. In an example embodiment, the second TSV 105b may electrically connect a second upper pad 172a, disposed in the upper device 102, to a second lower pad 172b disposed in the lower device 101.

The plurality of cell circuits 125, the plurality of photodiodes PD, the plurality of color filters 163, and the plurality of lenses 164 may be vertically aligned and overlap. For example, a corresponding cell circuit 125, photodiode PD, color filter 163, and lens 164 may be vertically aligned and overlap so as to be defined by a corresponding isolation area PI and grid pattern 162. Particularly, the source follower transistors SF1 to SF3 and the selection transistors SX1 to SX3 of each of the cell circuits 125 may be aligned and overlap a corresponding photodiode PD, color filter 163, and lens 164, and thus, an additional transistor area may not be needed. Accordingly, according to the present example embodiment, a degree of cell integration (for example, a degree of pixel integration or a resolution) of the image sensor 100A may be enhanced.

The image sensor according to the example embodiments may include a transistor including a plurality of protruding channel regions, and thus, a charge transfer path of a transfer transistor structure may be simplified, thereby removing a potential barrier.

The image sensor according to the example embodiments may include a gate structure surrounding side surfaces of a channel region, and thus, electric charges may be transferred through a bulk area (bulk-conducting). Accordingly, in the transfer transistor structure, a dark current and a charge trap each caused by a surface and a gate insulation layer may be prevented or reduced.

The image sensor according to the example embodiments may include a transfer transistor structure including a plurality of protruding channel regions, a source follower transistor structure, a selection transistor structure, and a reset transistor structure in one unit pixel area, thereby enhancing a degree of integration. That is, a separate transistor area may not be needed.

The image sensor according to the example embodiments may include a gate structure having a gate-all-around (GAA) structure, thereby enhancing charge transfer performance and transistor driving performance.

While example embodiments have been shown and described, it will be apparent to those skilled in the art that various changes and modifications may be made without departing from the spirit and scope of the present disclosure as set forth in the following claims.

What is claimed is:

1. An image sensor comprising:
   a semiconductor substrate;
   a plurality of pillars, wherein each pillar of the plurality of pillars protrudes from the semiconductor substrate, wherein the plurality of pillars are spaced from each other;
   a spacer layer on the semiconductor substrate and a sidewall of each of the plurality of pillars;
   a plurality of gate structures on the spacer layer; and
   a plurality of unit pixels arranged in a matrix form, the plurality of unit pixels comprising a first unit pixel, a second unit pixel, a third unit pixel and a fourth unit pixel,
   wherein the first unit pixel comprises:
      a first photodiode (PD) formed in the semiconductor substrate;
      a first pillar, a second pillar, and a third pillar of the plurality of pillars;
      a first gate structure and a second gate structure of the plurality of gate structures;
      a first source area formed in the semiconductor substrate, the third pillar, and a lower region of the second pillar, the first source area does not vertically overlap the first pillar; and a first well area formed in the semiconductor substrate and surrounds a lower surface and a side surface of the first source area in the semiconductor substrate, wherein each of the first pillar and the second pillar comprises a first channel region and a first drain region on the first channel region, wherein the first gate structure comprises a first gate electrode surrounding a sidewall of the first channel region of the first pillar and a first gate dielectric layer between the first gate electrode and the first channel region of the first pillar, wherein the second gate structure comprises a second gate electrode surrounding a sidewall of the first channel region of the second pillar and a second gate dielectric layer between the second gate electrode and the first channel region of the second pillar, wherein the third pillar is not surrounded by any gate structure of the plurality of gate structures, wherein the first source area includes:
  a first source region in the semiconductor substrate;
  a second source region in the lower region of the second pillar and extending from the first source region in a vertical direction; and
  a third source region in the third pillar and extending from the first source region in the vertical direction, wherein an upper surface of the third source region is at a higher level than an upper surface of the second source region.

2. The image sensor of claim 1, wherein the first unit pixel comprises a first transfer transistor structure and a reset transistor structure, wherein the first transfer transistor structure comprises the first gate structure and the first channel region of the first pillar, and the first drain region of the first pillar, and wherein the reset transistor structure comprises the second gate structure and the first channel region of the second pillar, and the first drain region of the second pillar.

3. The image sensor of claim 1, wherein each of the second unit pixel, the third unit pixel and the fourth unit pixel comprises:

a second photodiode (PD) formed in the semiconductor substrate;

a fourth pillar, a fifth pillar and a sixth pillar of the plurality of pillars; and a third gate structure, a fourth gate structure and a fifth gate structure of the plurality of gate structures, wherein each of the fourth pillar, the fifth pillar and the sixth pillar comprises a second channel region and a second drain region on the second channel region, wherein the third gate structure comprises a third gate electrode surrounding a sidewall of the second channel region of the fourth pillar and a third gate dielectric layer between the third gate electrode and the second channel region of the fourth pillar, wherein the fourth gate structure comprises a fourth gate electrode surrounding a sidewall of the second channel region of the fifth pillar and a fourth gate dielectric layer between the fourth gate electrode and the second channel region of the fifth pillar, and wherein the fifth gate structure comprises a fifth gate electrode surrounding a sidewall of the second channel region of the sixth pillar and a fifth gate dielectric layer between the fifth gate electrode and the second channel region of the sixth pillar.

4. The image sensor of claim 3, wherein each of the second unit pixel, the third unit pixel, and the fourth unit pixel comprises a second transfer transistor structure, a source follower transistor structure, and a selection transistor structure, wherein the second transfer transistor structure comprises the third gate structure and the second channel region of the fourth pillar, and the second drain region of the fourth pillar, wherein the source follower transistor structure comprises the fourth gate structure and the second channel region of the fifth pillar, and the second drain region of the fifth pillar, and wherein the selection transistor structure comprises the fifth gate structure and the second channel region of the sixth pillar, and the second drain region of the sixth pillar.

5. The image sensor of claim 3, wherein each of the second unit pixel, the third unit pixel, and the fourth unit pixel further comprises:

a second well area formed in the semiconductor substrate; and a second source area formed in the semiconductor substrate and the fifth pillar, and the sixth pillar, wherein a portion of the second source area vertically overlaps the second channel region of each of the fifth pillar and the sixth pillar, and does not vertically overlap the second channel region of the fourth pillar, and wherein the second well area surrounds the second source area.

6. The image sensor of claim 3, wherein in a vertical cross-sectional view, each of the first gate dielectric layer, the second gate dielectric layer, the fourth gate dielectric layer, and the fifth gate dielectric layer is further disposed on the spacer layer, and has L-shape.

7. The image sensor of claim 2, wherein in a top view, the first transfer transistor structure and the reset transistor structure of the first unit pixel are vertically aligned with and overlap the first photodiode.

8. The image sensor of claim 4, wherein in a top view, the second transfer transistor structure, the source follower transistor structure, and the selection transistor structure of each of the second unit pixel, the third unit pixel, and the fourth unit pixel are vertically aligned with and overlap of the second photodiode.

9. The image sensor of claim 3, further comprising:

a plurality of isolation areas interposed between the first photodiode of the first unit pixel, the second photodiode of the second unit pixel, the second photodiode of the third unit pixel, and the second photodiode of the fourth unit pixel.

10. The image sensor of claim 9, further comprising:

a first color filter, a second color filter, a third color filter, a fourth color filter disposed on the semiconductor substrate to respectively and vertically overlap the first photodiode of the first unit pixel, the second photodiode of the second unit pixel, the second photodiode of the third unit pixel, and the second photodiode of the fourth unit pixel, respectively.

11. The image sensor of claim 10, further comprising:

a first lens, a second lens, a third lens, a fourth lens disposed on the semiconductor substrate to respectively and vertically overlap the first color filter, the second color filter, the third color filter and the fourth color filter, respectively.

12. The image sensor of claim 1, further comprising:
a first lower contact plug on and contacting an upper surface of the first pillar;
a second lower contact plug on and contacting an upper surface of the second pillar;
a first upper contact plug on and contacting an upper surface of the third pillar;
a first lower wiring disposed on the first lower contact plug and the second lower contact plug; and
a first upper wiring disposed on the first upper contact plug.

* * * * *